United States Patent [19]
Nagel et al.

[11] Patent Number: 5,994,153
[45] Date of Patent: Nov. 30, 1999

[54] FABRICATION PROCESS OF A CAPACITOR STRUCTURE OF SEMICONDUCTOR MEMORY CELL

[75] Inventors: Nicolas Nagel; Kenji Katori, both of Kanagawa, Japan

[73] Assignee: Sony Corporation, Japan

[21] Appl. No.: 09/217,071

[22] Filed: Dec. 21, 1998

Related U.S. Application Data

[62] Division of application No. 08/958,444, Oct. 27, 1997, Pat. No. 5,864,153.

[30] Foreign Application Priority Data

Nov. 5, 1996 [JP] Japan ................................. 8-308705
Dec. 27, 1996 [JP] Japan ................................. 8-350912

[51] Int. Cl.⁶ ..................................................... H01G 7/06
[52] U.S. Cl. .............................................. 438/3; 438/240
[58] Field of Search ...................................... 438/238–240, 438/381–397, 3

[56] References Cited

U.S. PATENT DOCUMENTS 5,366,920 11/1994 Yamamichi et al. .
5,496,437 3/1996 Desu et al. ........................... 156/643.1

Primary Examiner—Jey Tsai
Attorney, Agent, or Firm—Rader, Fishman & Grauer; Ronald P. Kananen

[57] ABSTRACT

A capacitor structure of a semiconductor memory cell such as a FERAM has an upper electrode less susceptible a damage even by heat-treatment in a hydrogen gas atmosphere. The capacitor structure includes a lower electrode, a capacitor thin film formed of a ferroelectric thin film formed on the lower electrode, and an upper electrode formed on the capacitor thin film. The upper electrode is made of $Ru_{1-x}O_x$ ($0.1 < x < 0.64$).

9 Claims, 18 Drawing Sheets

[STEP-430]

[STEP-440]

[STEP-450]

[STEP-470]
(IN FORMING GAS)

[STEP-480]

[STEP-480] (CONTINUED)

[STEP-510]

[STEP-520]

[STEP-550]

F I G. 15
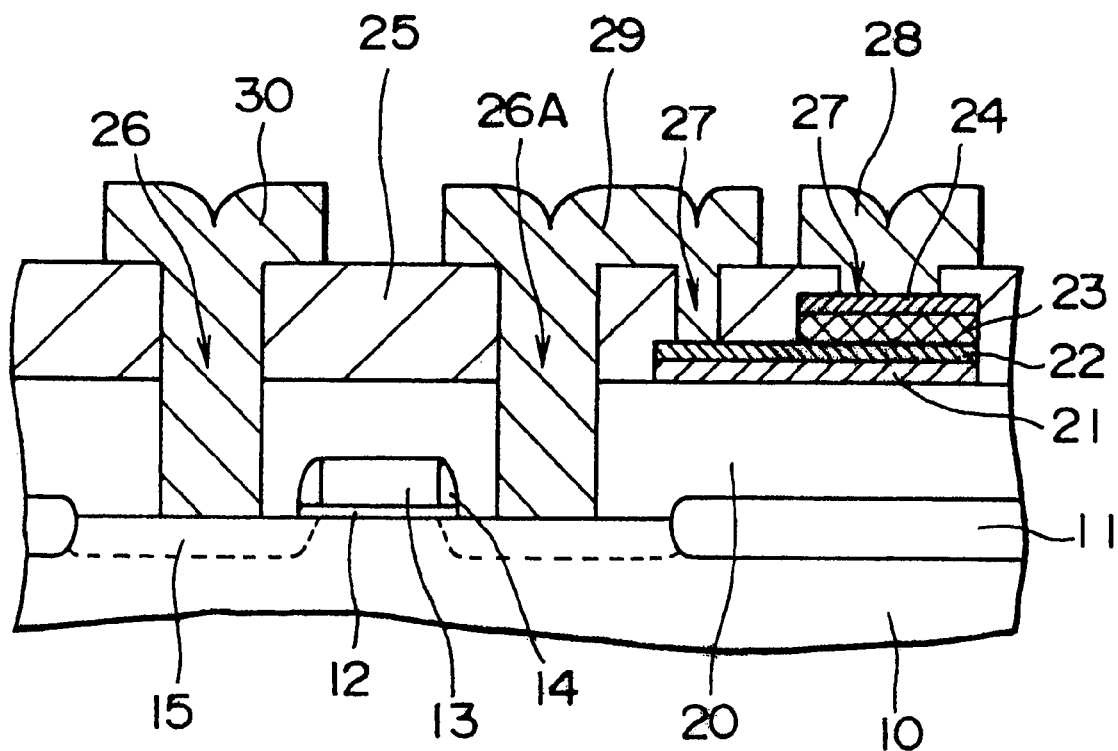

FABRICATION PROCESS OF A CAPACITOR STRUCTURE OF SEMICONDUCTOR MEMORY CELL

This application is a divisional of application Ser. No. 08/958,444 filed Oct. 27, 1997, U.S. Pat. No. 5,864,153.

BACKGROUND OF THE INVENTION

1. Field of the Invention

The present invention relates to a capacitor structure of a semiconductor memory cell using a ferroelectric thin film and a fabrication process thereof, and particularly to a capacitor structure of a nonvolatile semiconductor memory cell (so-called FERAM) or DRAM using a ferroelectric thin film and a fabrication process thereof.

2. Description of the Related Art

In recent years, with advance of the film formation technique, applied researches have been extensively made on nonvolatile semiconductor memories using ferroelectric thin films. The nonvolatile semiconductor memory allows high speed rewriting by making use of high speed polarization reversal and its residual polarization of a ferroelectric thin film. The nonvolatile semiconductor memories including ferroelectric thin films, which are being studied at present, are classified into a type of detecting the amount of electric charges stored in a ferroelectric capacitor portion and a type of detecting a change in resistance of a semiconductor due to spontaneous polarization of a ferroelectric material. The semiconductor memory cell, to which the present invention is applied, is the former type.

The nonvolatile semiconductor memory cell of the type of detecting a change in the amount of electric charges stored in a ferroelectric capacitor portion, is basically composed of a ferroelectric capacitor portion and a selective transistor. The ferroelectric capacitor portion typically includes a lower electrode, an upper electrode, and a capacitor thin film composed of a ferroelectric thin film which is held therebetween and has a relatively high dielectric constant $\epsilon$. Writing and reading of data in and from the nonvolatile semiconductor memory cell of this type are performed using a P-E hysteresis loop of a ferroelectric material shown in FIG. 13. When an external electric field is applied to a ferroelectric thin film and then removed therefrom, the ferroelectric thin film exhibits a spontaneous polarization. When being applied with a positive external electric field, the ferroelectric thin film exhibits a residual polarization+Pr. Besides, when being applied with a negative external electric field, the ferroelectric thin film exhibits a residual polarization−Pr. Here, the case where the ferroelectric thin film exhibits the residual polarization+Pr (see a state "D" of FIG. 13) is taken as "0", and the case where it exhibits the residual polarization−Pr (see a state "A" of FIG. 13) is taken as "1".

To identify the state "1" or "0", for example, a positive external electric field is applied to the ferroelectric thin film. The ferroelectric thin film thus applied with the positive electric field exhibits a polarization shown by character C of FIG. 13. At this time, if the data is "0", the polarization state of the ferroelectric thin film is changed from the state "D" to "C". On the other hand, if the data is "1", the polarization state of the ferroelectric thin film is changed from the state "A" to "C" by way of "B". That is, if the data is "0", the ferroelectric thin film does not exhibit any polarization reversal. On the other hand, if the data is "1", it exhibits the polarization reversal. As a result, there occurs a difference in the amount of electric charges stored in the ferroelectric capacitor portion. Thus, the stored electric charges are detected as a signal current by turning on the selective transistor of the selected memory cell. When the external electric field is made zero after read-out of the data, the polarization state of the ferroelectric thin film becomes the state "D" of FIG. 13 even if the state is "0" or "1". Accordingly, in the case where the data is "1", the data "1" is written by applying a negative external electric field to change the state "D" to "A" by way of "E".

Capacitor structures of a type in which a lower electrode is provided on a buffer layer formed of Ti on a $SiO_2$ layer; a capacitor thin film is made from $Pb(Zr_{1-y}, Ti_y)O_3$; and an upper electrode is made from Pt (platinum), are known, for example, from Ramton Corporation, "FRAM Cell", Thomas Boehm, HE6-94-2001; "Polarization Fatigue Characteristics of Sol-Gel Ferroelectric $Pb(Zr_{0.4}Ti_{0.6})O_3$ Thin-Film Capacitors", T. Mihama, et al., Jpn. J. Appl. Phys. Vol. 33 (1994), pp 3996–4002; "Fatigue Characteristics of Sol-Gel Derived Pb (Zr, Ti)$O_3$ Thin Films", K. Amanuma, et al., Jpn. J. Appl. Phys. Vol. 33 (1994), pp 5211–5214; and "Low-temperature Preparation Of Pb(Zr, Ti)$O_3$ Thin Film", I. Kanno. et al., Jpn. J. Appl. Phys. Vol. 32 (1993), pp 4057–4060. Further, capacitor structures of a type in which a capacitor thin film is made from $SrBi_2Ta_2O_9$ in place of $Pb(Zr_{1-y}, Ti_y)O_3$, are known, for example, from WO93/12542, "Preparation and ferroelectric properties of $SrBi_2Ta_2O_9$ thin film", K. Amanuma, et al., Appl. Phys. Lett. 66(2), Jan. 9, 1995; and "A 256 kb Nonvolatile Ferroelectric Memory at 3 V and 10 ns", ISSC 94, PP 268. The use of Ru (ruthenium) added with a trace of oxygen as an electrode material is known from "Application of Ru film added with trace oxygen to BST film capacitor electrode" (Proceedings No. 2 of the 57th Meeting of Jpn. Soc. of Appl. Phys., 8p-H-18).

A process of fabricating a semiconductor memory cell generally includes various heat-treatment steps performed at a hydrogen gas atmosphere at temperatures in a range of 280 to 450° C. In such a heat-treatment, hydrogen gas may permeate an upper electrode. From this viewpoint, one example of a process of fabricating a semiconductor memory cell will be briefly described with reference to FIGS. 14A and 14B and FIG. 15 which typically show the partial cross-section of a semiconductor substrate and the like.

The description will be made of a so-called planar type volatile semiconductor memory cell including a MOS transistor element as a selective transistor and a capacitor structure (ferroelectric capacitor portion). The capacitor structure includes a lower electrode 22, a capacitor thin film 23 composed of a ferroelectric thin film formed on the lower electrode 22, and an upper electrode 24 formed on the capacitor thin film 23. The lower electrode 22 is electrically connected to one source/drain region 15 of the MOS transistor element through a contact plug 26A and an interconnection 29. The upper electrode 24 is connected to a plate line 28. The other source/drain region 15 of the MOS transistor element is connected to a bit line 30.

The MOS transistor is formed on a semiconductor substrate 10 in accordance with a known process, and a multi-layered interlayer insulating film 20 having, for example, a SiN layer, a BPSG layer, and a NSG layer, is formed over the entire surface by CVD. In the figures, the interlayer insulating film 20 having the multi-layered structure is shown as that having a single layer structure for simplification. A buffer layer 21 made from Ti, a lower electrode layer made from Pt, a ferroelectric thin film, and an upper electrode layer made from Pt are sequentially formed on the interlayer insulating film 20, and the upper electrode layer, ferroelectric thin film, lower electrode layer, and buffer layer are patterned, to form a capacitor structure shown in FIG. 14A. The ferroelectric thin film is made from a material expressed by $$Bi_xSr_yTa_2O_d \quad (2)$$

where $1.7 \leq X \leq 2.5$, $0.6 \leq Y \leq 1.2$, and $8.0 \leq d \leq 10.0$. In the figure, reference numeral 11 indicates an isolation region, 12 is a gate oxide film, 13 is a gate electrode, and 14 is a gate oxide wall.

A multi-layered insulating film 25, having a $SiO_2$ layer formed using TEOS by plasma CVD, $O_3$-NSG layer, and a $SiO_2$ layer formed using TEOS by plasma CVD, is formed. In the figures, the insulating layer 25 is shown as that having a single layer structure for simplification. The atmosphere for forming the $SiO_2$ layer using TEOS by plasma CVD is a hydrogen rich atmosphere, and in this step, the semiconductor substrate is heated at about 400° C. Next, openings 26 are formed in the insulating film 25 and the interlayer insulating layer 20 at positions over the source/drain region 15 of the MOS transistor by RIE (see FIG. 14B). To reduce a trap density at a $SiO_2/Si$ interface of the MOS transistor, the semiconductor substrate is annealed in a forming gas composed of a mixed gas of $N_2$ gas/$H_2$ gas (5 vol %) at a temperature of 400 to 450° C. At this time, hydrogen gas permeates the upper electrode 24 made from Pt through the insulating film 25, and further it permeates the capacitor film 23.

Openings 27 are formed in a portion of the insulating film 25 over the lower electrode 22 extending from the capacitor structure and also in a portion of the insulating film 25 over the upper electrode 24. A metal interconnection layer is formed by sputtering over the entire surface including the interiors of the openings 26 and 27, and is patterned to form the plate line 28, interconnection 29, and bit line 30 (see FIG. 15). Finally, a passivation film made from SiN is formed over the entire surface by plasma CVD. The concentration of hydrogen gas in the atmosphere used for formation of the. passivation film is 15–30 vol %, and in this step, the semiconductor substrate is heated at a temperature of 280 to 350° C.

The upper electrode 24 made from Pt is damaged by the heat-treatments in the hydrogen gas atmosphere used for film formation by various CVD processes and for annealing in the forming gas. It is to be noted that the annealing in the forming gas is sometimes referred to simply to "annealing" hereinafter. The reason why the upper electrode 24 is damaged is that hydrogen gas, which has permeated the upper electrode 24 and further reached the capacitor thin film 23 formed of the ferroelectric thin film, reacts with oxygen atoms constituting the ferroelectric thin film, and thereby Bi atoms of the ferroelectric thin film made from $Bi_xSr_yTa_2O_d$ expressed in the equation (2) react with hydrogen to produce $H_2O$, as a result of which the upper electrode 24 made from Pt is damaged due to the attack of $H_2O$.

FIGS. 16A and 16B each show the result of microscopically observing a surface of an upper electrode of a capacitor structure provided on a buffer layer formed of Ti on an interlayer insulating film made from $SiO_2$, wherein FIG. 16A shows a state of the upper electrode before annealing, and FIG. 16B shows a state of the upper electrode after annealing performed in a forming gas at 430° C. for one hour. In addition, the capacitor structure is composed of a lower electrode layer made from Pt, a ferroelectric thin film made from $Bi_xSr_yTa_2O_d$ expressed in the equation (2), and the upper electrode made from Pt. As will be apparent from comparison between the states shown in FIGS. 16A and 16B, the upper electrode after annealing in the forming gas is damaged. In addition, an upper electrode made from Ru or $RuO_2$ is also damaged after annealing in the forming gas.

The occurrence of a damage in the upper electrode leads to short-circuit or reduction in the value of 2Pr of a P-E hysteresis loop of the ferroelectric thin film. In the worst case, the upper electrode is peeled from the capacitor thin film. FIG. 17 shows a difference between the P-E hysteresis loops of a ferroelectric thin film before and after annealing in a forming gas. The values of 2Pr and $Ec^+$ and $Ec^-$ (critical field voltage) of the P-E hysteresis loops of the ferroelectric thin film before and after annealing are shown in Table 1. As will be apparent from Table 1, the value of 2Pr of the ferroelectric thin film after annealing in the forming gas is largely smaller than that of the ferroelectric thin film before annealing.

TABLE 1

| | before annealing | after annealing |
|---|---|---|
| 2Pr ($\mu C/cm^2$) | 23.11 | 15.46 |
| $Ec^+$ (kV/cm) | 43.45 | 55.46 |
| $Ec^-$ (kV/cm) | −47.52 | −47.22 |

OBJECT AND SUMMARY OF THE INVENTION

An object of the present invention is to provide a capacitor structure of a semiconductor memory cell, which is less susceptible to a damage by heat-treatment in a hydrogen gas atmosphere, and a fabrication process thereof.

To achieve the above object, according to the present invention, there is provided a capacitor structure of a semiconductor memory cell, including: a lower electrode; a capacitor thin film composed of a ferroelectric thin film formed on the lower electrode; and an upper electrode formed on the capacitor thin film; wherein the upper electrode is made from $Ru_{1-x}O_x$ where $0.1<x<0.64$. If the value of X is out of the above range, the upper electrode is susceptible to a large damage due to heat-treatment in a hydrogen gas atmosphere.

To achieve the above object, according to a first aspect of the present invention, there is provided a process of fabricating a capacitor structure of a semiconductor memory cell including a lower electrode, a capacitor thin film composed of a ferroelectric thin film formed on the lower electrode, and an upper electrode formed on the capacitor thin film, including the step of: forming the upper electrode layer made from $Ru_{1-x}O_x$ where $0.1<x<0.64$, on the ferroelectric thin film by sputtering, reactive sputtering, electron beam deposition, or MOCVD.

The above process of fabricating a capacitor structure of a semiconductor memory cell according to the first aspect of the present invention, may further include the step of heat-treating the upper electrode layer formed by sputtering, reactive sputtering, electron beam deposition, or MOCVD in an oxygen gas atmosphere at a temperature T° C. (T<625). The lower limit of the heat-treatment temperature T° C. may be determined depending on a heat-treatment apparatus used.

Here, the heat-treatment in an oxygen gas atmosphere at a temperature T° C. means that a semiconductor substrate is heat-treated in the oxygen gas atmosphere in a state being heated at T° C. The same shall apply hereinafter. In addition, the oxygen gas atmosphere may contain an inert gas.

To achieve the above object, according to a second aspect of the present invention, there is provided a process of fabricating a capacitor structure of a semiconductor memory cell including a lower electrode, a capacitor thin film composed of a ferroelectric thin film formed on the lower electrode, and an upper electrode formed on the capacitor thin film, including the steps of: forming a Ru layer on the ferroelectric thin film by sputtering, reactive sputtering, electron beam deposition, or MOCVD; and heat-treating the Ru layer in an oxygen gas atmosphere at a temperature T° C. (575<T'<625); whereby the upper electrode layer made from $Ru_{1-x}O_x$ where 0.1<x<0.64 is formed on the ferroelectric thin film.

The ferroelectric thin film forming the capacitor structure of the present invention may be made from a ferroelectric material of a Bi based layer structure perovskite type. The ferroelectric material of the Bi based layer structure perovskite type belongs to a so-called non-stoichiometric compound having tolerances in deviation of composition at both sites of a metal element and an anion element (for example, O), and it often exhibits the optimum electric characteristic at a composition slightly out of the stoichiometric one. The ferroelectric material of the Bi based layer structure perovskite type according to the present invention can be expressed, for example, a general chemical equation of $(Bi_2O_2)^{2+}(A_{m-1}B_mO_{3m+1})^{2-}$ where A is one kind of a metal selected from a group consisting of Bi, Pb, Ba, Sr, Ca, Na, K, Cd and the like, and B is one kind of metal or a combination at an arbitrary ratio of a plurality of kinds of metals selected from a group consisting of Ti, Nb, Ta, W, Mo, Fe, Co and Cr. Character m indicates an integer of 1 or more.

The ferroelectric thin film of the present invention preferably contains, as a main crystal phase, a crystal phase expressed by

$$Bi_X(Sr, Ca, Ba)_Y(Ta_z, Nb_{1-z})_2O_d \quad (1)$$

where $1.7 \leq X \leq 2.5$, $0.6 \leq Y \leq 1.2$, $0 \leq Z \leq 1.0$, and $8.0 \leq d \leq 10.0$.

In addition, (Sr, Ca, Ba) means one element selected from a group consisting of Sr, Ca and Ba. The ferroelectric thin film also preferably contains, as a main crystal phase, a crystal phase expressed by

$$Bi_XSr_YTa_zO_d \quad (2)$$

where $1.7 \leq X \leq 2.5$, $0.6 \leq Y \leq 1.2$, and $8.0 \leq d \leq 10.0$.

The ferroelectric thin film more preferably contains, as a main crystal phase, 85% or more of the crystal phase expressed by the equation (1) or (2). The ferroelectric thin film containing, as a main crystal phase, the crystal phase expressed by the equation (1) or (2) may slightly contain an oxide of Bi, an oxide of Ta or Nb, or a complex oxide of Bi, Ta and Nb. Here, examples of stoichiometric compositions of the ferroelectric thin film expressed by the equation (1) may include $Bi_2SrTa_2O_9$, $Bi_2SrNb_2O_9$, $Bi_2BaTa_2O_9$, and $Bi_2SrTaNbO_9$. Also the ferroelectric thin film of the present invention may be made from $Bi_4SrTi_4O_{15}$, $Bi_4Ti_3O_{12}$, or $Bi_2PbTa_2O_9$, wherein the content of each metal element is variable to the extent it does not change the crystal structure. In addition, the material forming the ferroelectric thin film may be also represented by $PbTiO_3$, lead titanate-zirconate [PZT, $Pb(Zr_{1-y}, Ti_y)O_3$, 0<y<1] which is a solid-solution of $PbZrO_3$ having a perovskite structure and $PbTiO_3$; and a PZT based compound such as PLZT which is a metal oxide where PZT is added with La or PNZT which is a metal oxide where PZT is added with Nb. The ferroelectric thin film can be formed by, for example, a MOCVD, pulse laser abrasion, sputtering, or sol-gel process. The patterning of the ferroelectric thin film can be performed by, for example, RIE.

Specific examples of materials forming the lower electrode of the present invention may include $Ru_{1-x}O_x$ (0.1<x<0.64), Ru, $RuO_2$ $IrO_2$, Pt, Pd, stacked structures of Pt/Ti, Pt/Ta and Pt/Ti/Ta, $La_{0.5}Sr_{0.5}CoO_3$(LSCO), stacked structure of Pt/LSCO, and $YBa_2Cu_3O_7$. In the stacked structure, the material described before "/" forms the upper layer (ferroelectric thin film side) and the material described after "/" forms the lower layer. The lower electrode can be suitably formed by, for example, sputtering, reactive sputtering, electron beam deposition, MOCVD, or pulse laser abrasion. The patterning of the material forming the lower electrode can be performed by, for example, ion milling or RIE.

The value of x can be obtained by measuring an X-ray diffraction pattern of the upper electrode using an X-ray diffraction device, and calculating a ratio between peak values of the X-ray diffraction patterns of Ru and $RuO_2$.

According to the present invention, the use of the upper electrode made from $Ru_{1-x}O_x$ (0.1<x<0.64) prevents hydrogen gas from reaching the ferroelectric thin film, to thereby provide a capacitor structure of a semiconductor memory cell in which an upper electrode is less susceptible to a damage even by heat-treatment in a hydrogen gas atmosphere.

BRIEF DESCRIPTION OF THE DRAWINGS

FIGS. 14A, 14B and 15 are typical partial sectional views of a semiconductor substrate and the like, illustrating the outline of a related art process of fabricating a semiconductor memory cell;

DESCRIPTION OF THE PREFERRED EMBODIMENTS

Hereinafter, preferred embodiments of the present invention will be described with reference to the accompanying drawings.

Embodiment 1

This embodiment concerns the process of fabricating a capacitor structure of a semiconductor memory cell according to the first aspect of the present invention. In this embodiment, samples in which upper electrodes made from $Ru_{1-x}O_x$ (0.1<x<0.64) are formed by sputtering are prepared, and are examined in terms of a relationship between the value of x and a generation state of a damage of each upper electrode in a forming gas.

In this embodiment, the samples were fabricated in accordance with the following procedure. A $SiO_2$ layer was formed on a silicon semiconductor substrate, a buffer layer made from Ti was formed thereon by sputtering, and a lower electrode layer made from Pt was formed on the buffer layer by sputtering. Next, a ferroelectric thin film (thickness: about 0.2 µm) made from $Bi_xSr_yTa_2O_d$ expressed in the above equation (2) was formed over the entire surface by a sol-gel process. The ferroelectric thin film thus formed was subjected to post-baking in an oxygen gas atmosphere at 800° C. for one hour for promoting crystallization of the thin film. An upper electrode layer made from $Ru_{1-x}O_x$ was formed on the ferroelectric thin film by RF sputtering. The upper electrode layer, ferroelectric thin film, lower electrode layer, and buffer layer were patterned to form a capacitor structure. The film formation conditions of the buffer layer, lower electrode layer, and upper electrode layer made from $Ru_{1-x}O_x$ were shown in Tables 2 and 3. In this way, several kinds of samples having different values x of the material $Ru_{1-x}O_x$ were prepared. In addition, the upper electrode of the sample was exposed. In Tables 2 and 3, the wording "distance from the target" means the distance from the target to the semiconductor substrate.

Figure 1:
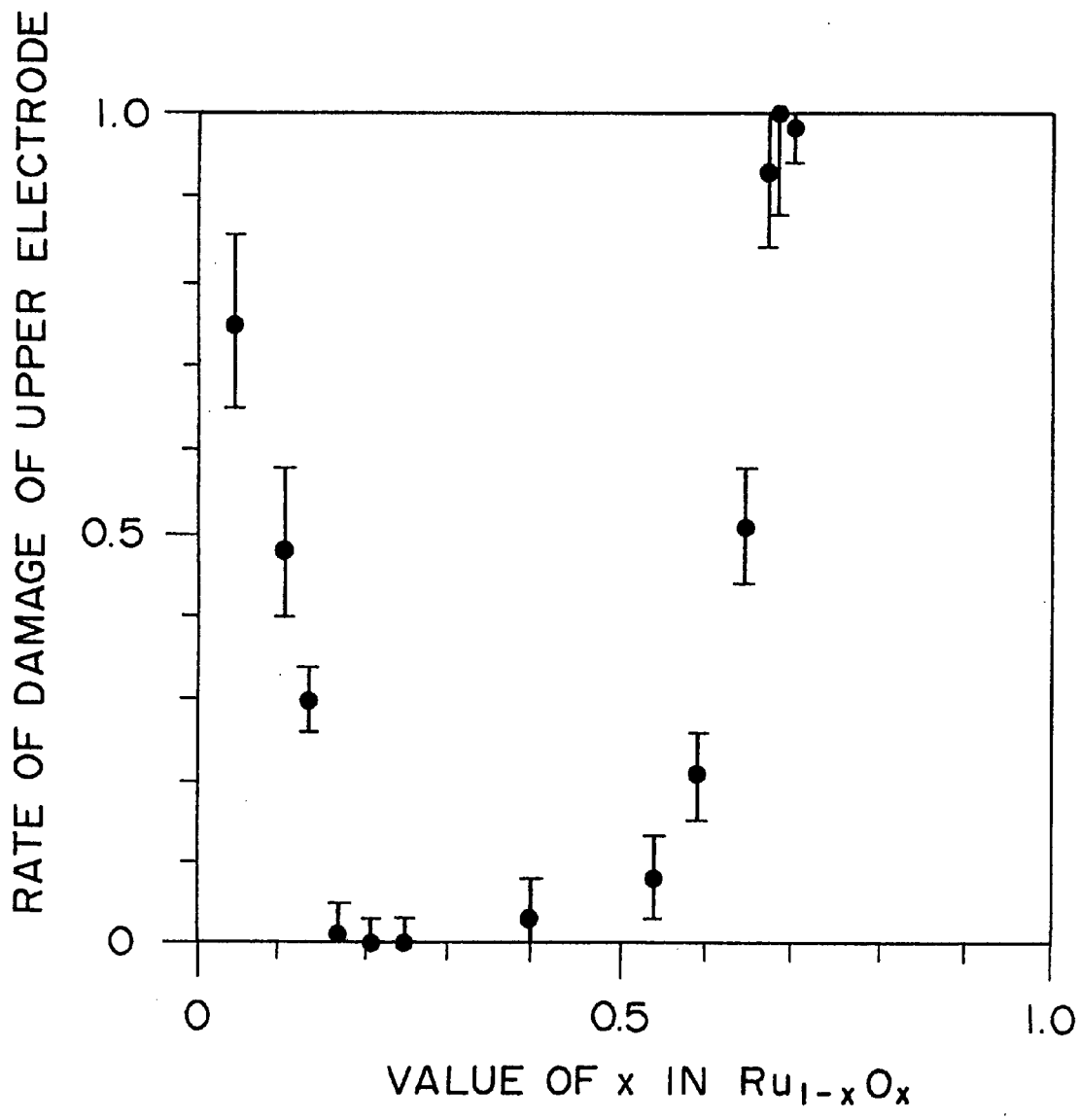
FIG. 1 is a graph showing results of examining, in Embodiment 1, a relationship between the value of x and a generation state of a damage of an upper electrode in a hydrogen gas atmosphere.
Figure 2A:
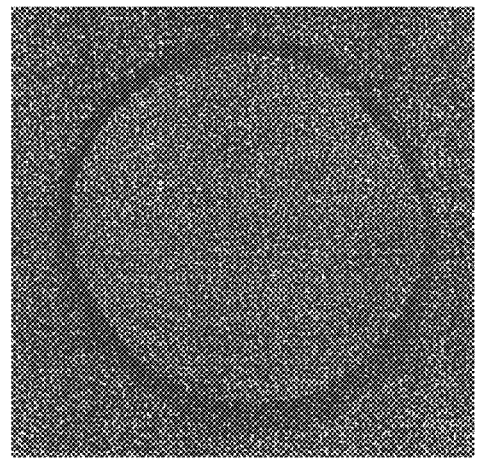
FIGS. 2A to 2C are photographs showing results of microscopically observing upper electrodes of capacitor structures obtained in Embodiments 1, 2 and 3.

Table 2
[Film Formation Condition of Buffer Layer Made from Ti]
    target: Ti
    process gas: Ar=40 sccm
    pressure: 0.2 Pa
    DC power: 380–450 W
    distance from target: about 30 cm
    sputtering rate: 5–10 nm/min
    film thickness: about 30 nm
[Film Formation Condition of Lower Electrode Layer Made from Pt]
    target: Pt
    process gas: Ar=40 sccm
    pressure: 0.2 Pa
    DC power: 150–300 W
    distance from target: about 30 cm
    sputtering rate: 5–10 nm/min
    film thickness: about 0.2 µm
Table 3
[Film Formation Condition of Upper Electrode Layer Made from $(Ru_{1-x}O_x)$]
    target: Ru
    process gas: total of $Ar/O_2$=30 sccm
    oxygen concentration in process gas: variable from 0.1 to 50 vol %
    pressure: 0.3 Pa
    power: 200 W
    distance from target: 80–90 mm
    sputtering rate: 5–20 nm/min
    film thickness: about 0.2 µm The samples having the different values of x were annealed in a forming gas composed of a mixed gas of $N_2$ gas/$H_2$ gas (5 vol %) at 430° C. for one hour, and were microscopically observed to examine generation states of damages of the upper electrodes of the samples. The results of examining a relationship between the values of x and generation states of damages of the upper electrodes in the forming gas are summarized in FIG. 1. In the figure, the ordinate indicates an area ratio between a region of the upper electrode in which a damage occurs and the upper electrode. The results of this graph show that the damage of the upper electrode in the forming gas (hydrogen gas atmosphere) is reduced if the value of x satisfies a relationship of 0.1<x<0.64, and further the damage is significantly reduced if the value of x satisfies a relationship of 0.15<x<0.5. FIG. 2A shows a microscopic photograph of the upper electrode made from $Ru_{1-x}O_x$ (x=0.3) formed using the process gas of $Ar/O_2$ (flow rate: 29 sccm/1 sccm) and then annealed in the forming gas. From the microscopic photograph of FIG. 2A, it becomes apparent that any damage is not observed in the upper electrode after annealing in the forming gas.

Embodiment 2

Figure 3:
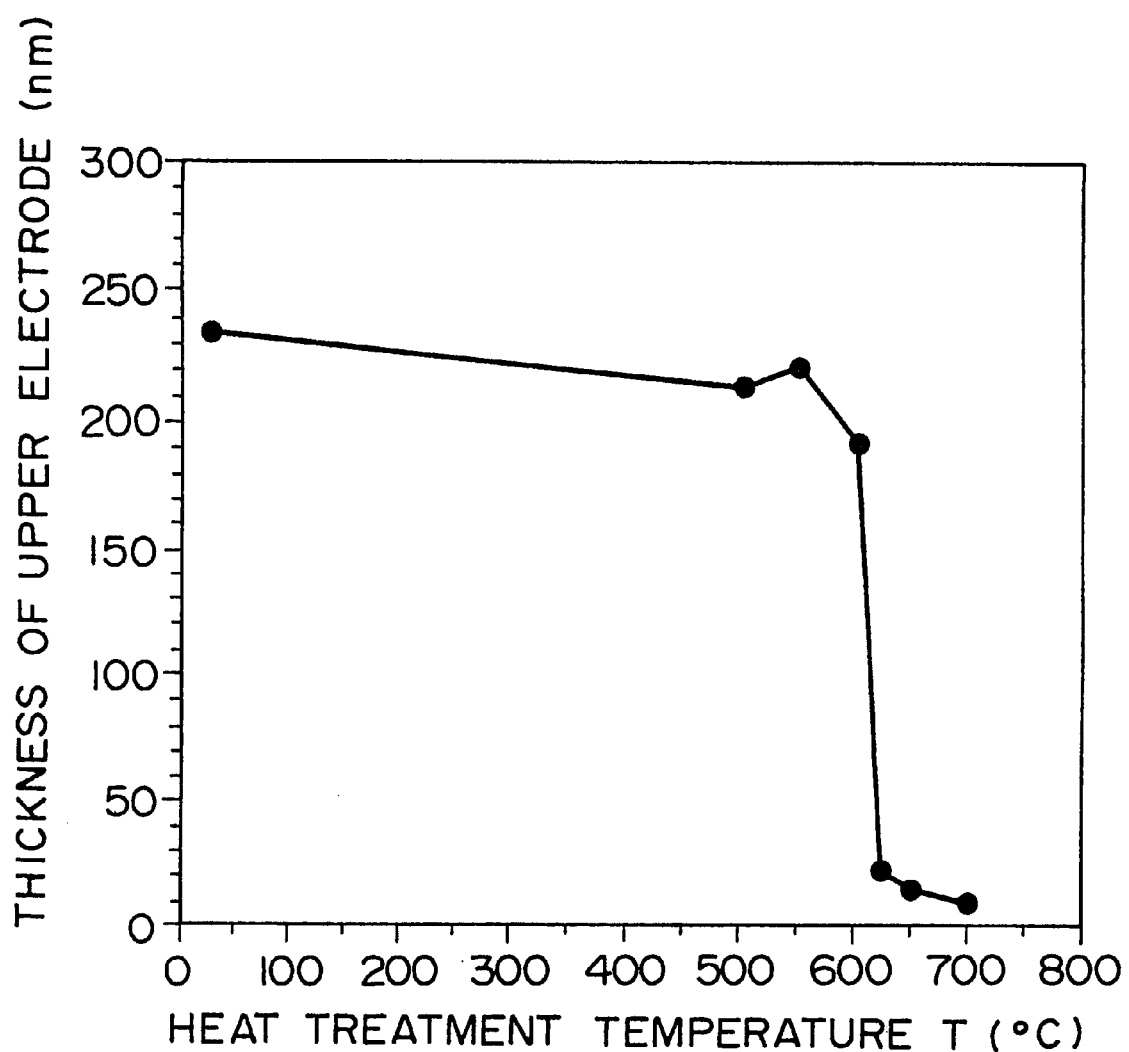
FIG. 3 is a graph showing results of measuring, in Embodiment 2, thicknesses of upper electrodes after being heat-treated in an oxygen gas atmosphere at various heat-treatment temperatures.
Figure 18:
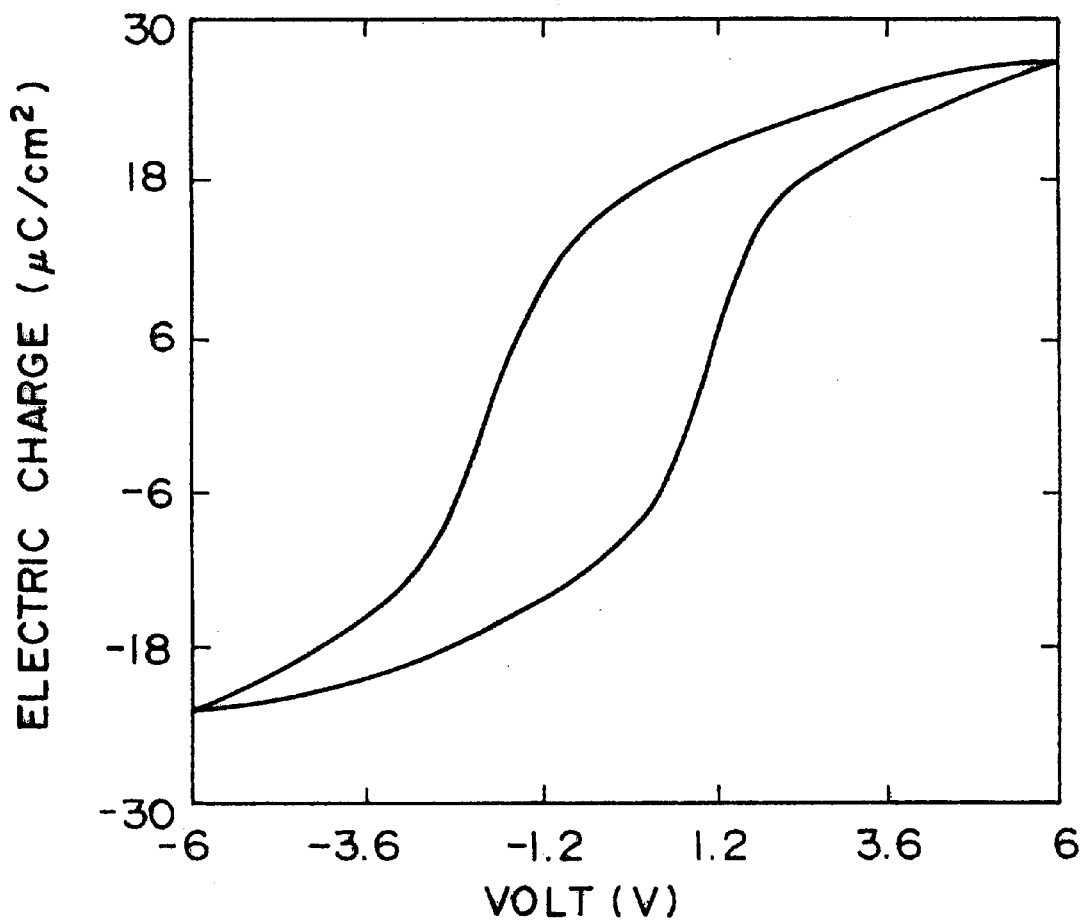
FIG. 18 is a graph showing a P-E hysteresis loop of a ferroelectric thin film in the case where an upper electrode made from $Ru_{1-x}O_x$ is not heat-treated in an oxygen gas atmosphere.

This is a modification of Embodiment 1, and is different from Embodiment 1 in that an upper electrode layer formed by sputtering is heat-treated in an oxygen gas atmosphere at a temperature T° C. (T<625). Unless an upper electrode layer made from $Ru_{1-x}O_x$ is heat-treated in an oxygen gas atmosphere, the value of $Ec^-$ of a P-E hysteresis loop of a ferroelectric thin film may be shifted onto the negative side as shown in FIG. 18, and further a contact failure may occur between the upper electrode and a capacitor thin film. In addition, the values of 2Pr, $Ec^+$ and $Ec^-$ of the P-E hysteresis loop in FIG. 18 are shown in Table 4.
Table 4
    2 Pr=26.57 µC/cm$^2$
    $Ec^+$=36.91 kV/cm
    $Ec^-$=−75.90 kV/cm To prevent occurrence of these phenomena, it is preferred that the upper electrode layer formed by sputtering is heat-treated in an oxygen gas atmosphere at a temperature T° C. (T<625). The thicknesses of the upper electrodes after heat-treatment performed in the oxygen gas atmosphere (flow rate of oxygen: 8 l/min) at various heat-treatment temperatures T° C. for 15 min were measured. The results are shown in FIG. 3. In addition, the capacitor structure was the same as that in Embodiment 1; the film formation conditions of the buffer layer and the lower electrode layer were the same as those shown in Table 2; and the film thickness of the ferroelectric thin film was about 0.2 µm. The film formation condition of the upper electrode layer made from $Ru_{1-x}O_x$ is shown in Table 5.

Table 5
[Film Formation Condition of Upper Electrode Layer Made from $Ru_{1-x}O_x$]
  target: Ru
  process gas: $Ar/O_2$=29.5 sccm/0.5 sccm
  pressure: 0.3 Pa
  power: 200 W
  distance from target: 80–90 mm
  sputtering rate: 5–20 nm/min
  film thickness: about 0.2 μm As will be apparent from FIG. 3, when the heat-treatment temperature T is more than 625° C., the thickness of the upper electrode is significantly reduced. This is because $Ru_{1-x}O_x$ is converted into $RuO_4$ and is evaporated.

Figure 2B:
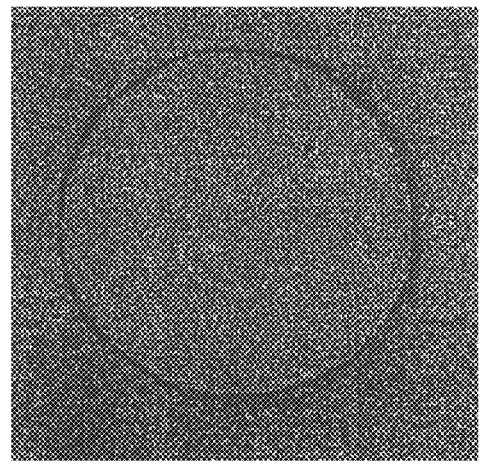
Figure 4:
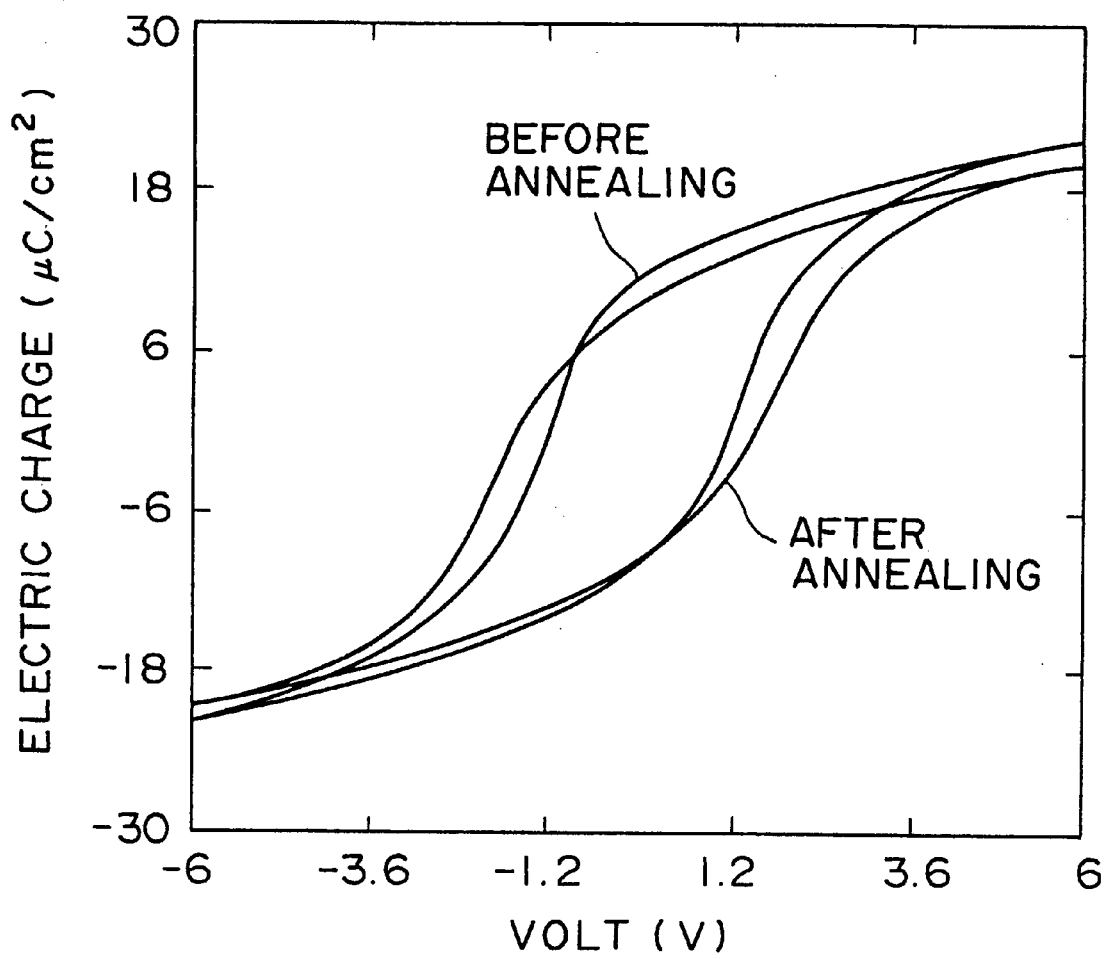
FIG. 4 is a graph showing P-E hysteresis loops of a ferroelectric thin film of a capacitor structure before and after annealing in Embodiment 2.

FIG. 2B shows a microscopic photograph of the upper electrode layer made from $Ru_{1-x}O_x$ which is formed using the process gas of $Ar/O_2$ (flow rate: 29.5 sccm/0.5 sccm), being heat-treated in the oxygen gas atmosphere (flow rate of oxygen: 8 l/min) at a heat-treatment temperature T=450° C. for 15 min, and annealed in a forming gas. The values of 2Pr, $Ec^+$ and $Ec^-$ of the P-E hysteresis loops (see FIG. 4) of the ferroelectric thin film before and after annealing in the forming gas are shown in Table 6. In addition, the value x is 0.3. From the microscopic photograph of FIG. 2B, it is apparent that any damage is not observed in the upper electrode after annealing in the forming gas. Also, a difference between the P-E hysteresis loops of the ferroelectric thin film before and after annealing in the forming gas is very small. While the flow rate of oxygen in the process gas upon formation of the upper electrode layer made from $Ru_{1-x}O_x$ is smaller than that in Embodiment 1, oxygen can be entrapped in the upper electrode by heat-treatment in the oxygen gas atmosphere.

TABLE 6

|  | before annealing | after annealing |
|---|---|---|
| 2Pr ($\mu C/cm^2$) | 21.43 | 19.49 |
| $Ec^+$ (kV/cm) | 45.67 | 62.24 |
| $Ec^-$ (kV/cm) | −45.47 | −62.42 |

Embodiment 3

This embodiment concerns the process of fabricating a capacitor structure of a semiconductor memory cell according to the second aspect of the present invention. In this embodiment, a Ru layer is formed by sputtering, and is heat-treated in an oxygen gas atmosphere at a temperature T'° C. (575<T<625), to form an upper electrode layer made from $Ru_{1-x}O_x$ (0.1<X<0.64). In this embodiment, a relationship between the heat-treatment temperature (T'° C.) and a generation state of a damage of the upper electrode in a forming gas was examined. The capacitor structure in this embodiment was the same as that in Embodiment 1. The film formation conditions of a buffer layer and a lower electrode layer were the same as those shown in Table 2, and the film thickness of a ferroelectric thin film was about 0.2 μm. The film formation condition of the Ru layer is shown in Table 7.

Figure 5:
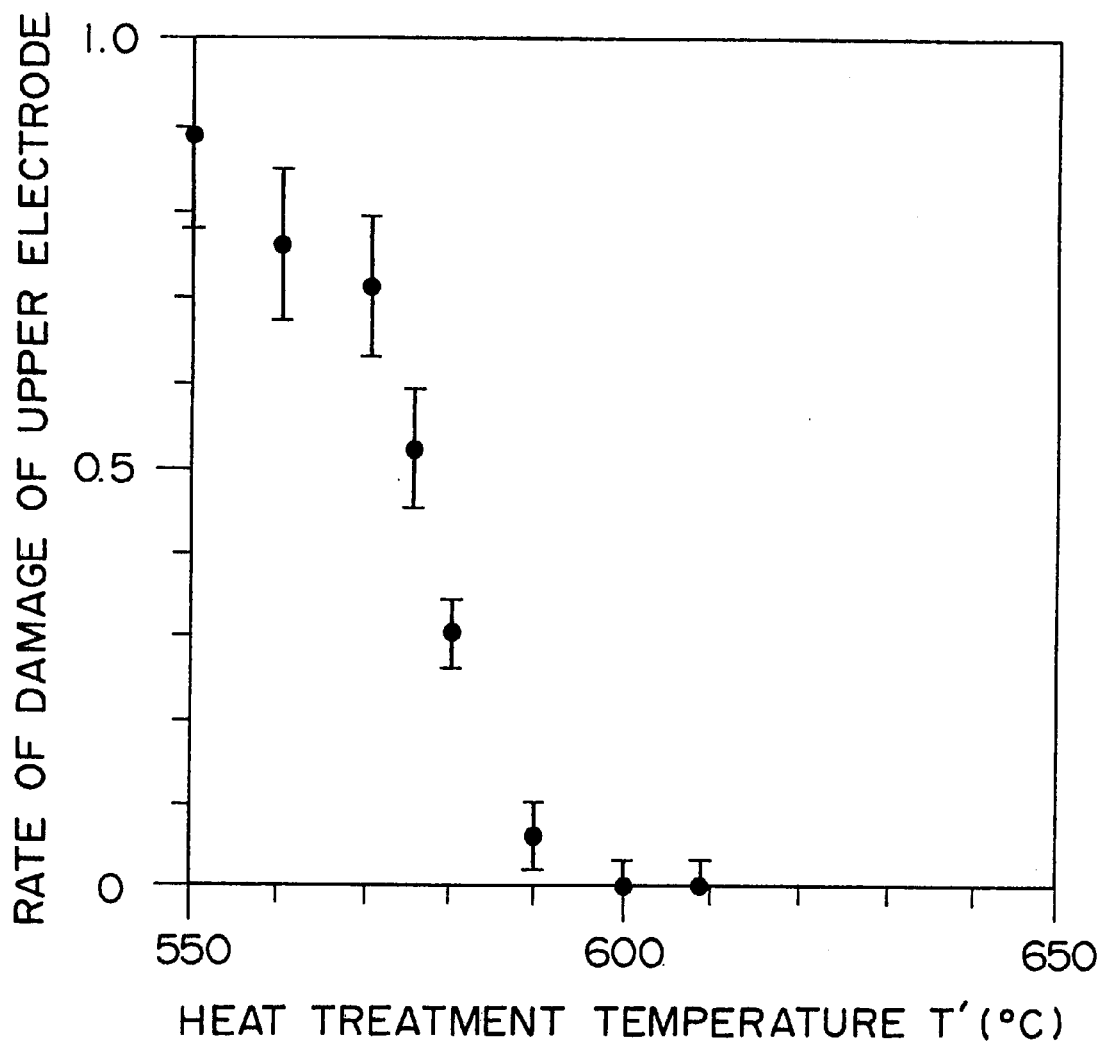
FIG. 5 is a graph showing results of examining a generation state of a damage in an upper electrode of a capacitor structure obtained in Embodiment 3.

Table 7
[Film Formation Condition of Ru Layer]
  target: Ru
  process gas: Ar=30 sccm
  pressure: 0.3 Pa
  power: 200 W
  distance from target: 80–90 mm
  sputtering rate: 5–10 nm/min
  film thickness: about 0.2 μm The Ru layers were heat-treated in the oxygen gas atmosphere (flow rate of oxygen: 8 l/min) at different heat-treatment temperatures T' for 15 min, to form the upper electrode layers made from $Ru_{1-x}O_x$. The upper electrode layers made from $Ru_{1-x}O_x$ were then annealed in the forming gas. FIG. 5 shows results of examining generation states of damages of the upper electrodes in the capacitor structures thus obtained. As will be apparent from FIG. 5, when the heat-treatment temperature T' is 575° C. or less, a number of damages occur in the upper electrode because of insufficient oxidation of the Ru layer. On the other hand, when the heat-treatment temperature T' is 625° C. or more, the film thickness of the upper electrode is significantly reduced. Accordingly, it is revealed that heat-treatment of the Ru layer in the oxygen gas atmosphere at the heat-treatment temperature T' (575<T'<625) makes it possible to certainly prevent occurrence of a damage in the upper electrode upon annealing in the forming gas (hydrogen gas atmosphere).

Figure 2C:
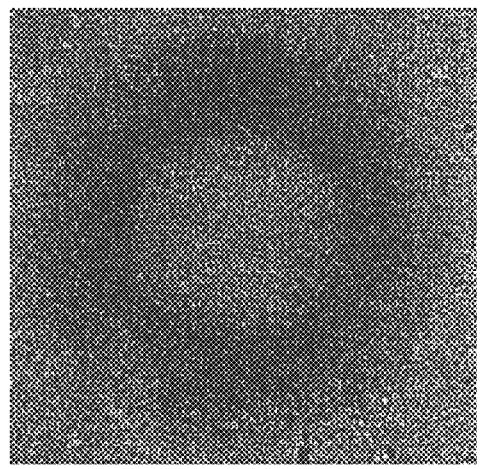
Figure 6:
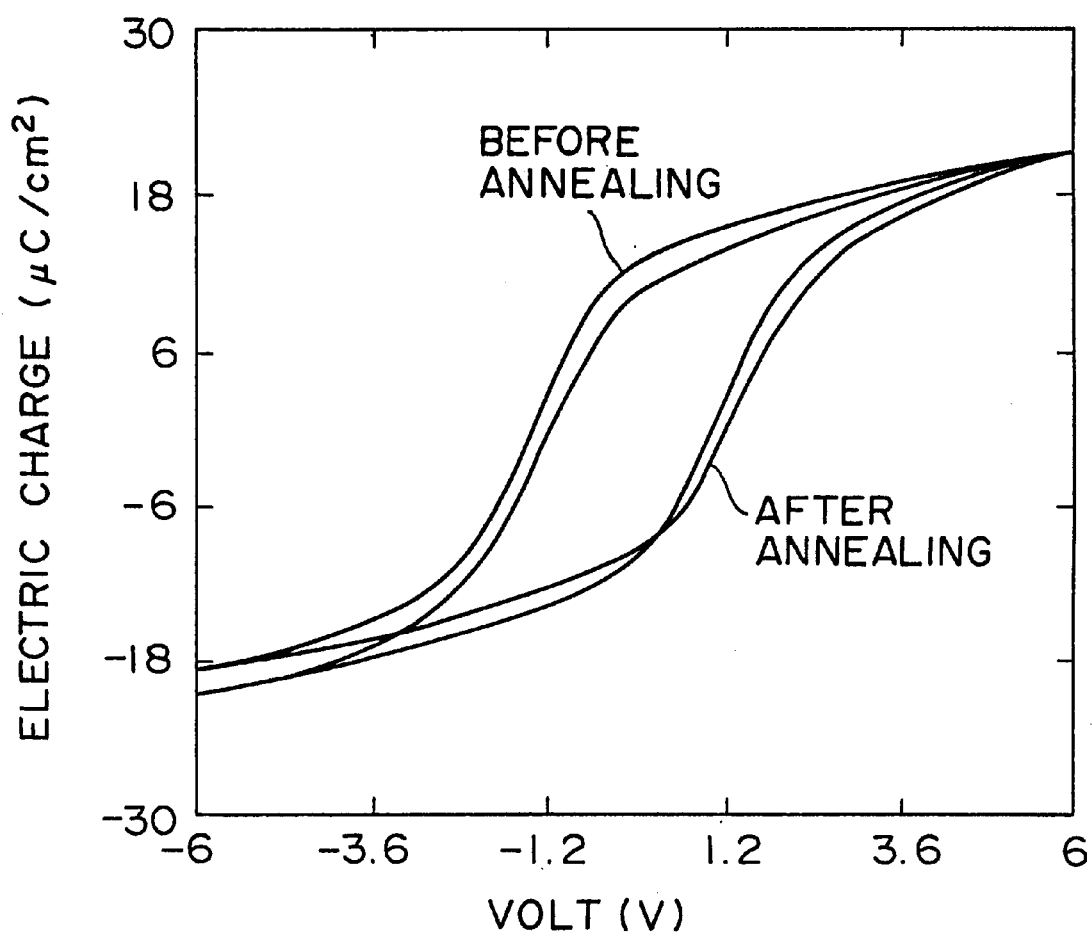
FIG. 6 is a graph showing P-E hysteresis loops of the ferroelectric thin film of the capacitor structure before and after annealing in Embodiment 3.

FIG. 2C shows a microscopic photograph of the upper electrode of the capacitor structure heat-treated at a heat-treatment temperature T'=600° C. and then annealed in the forming gas. The values of 2Pr, $Ec^+$ and $Ec^-$ of the P-E hysteresis loops (see FIG. 6) of the ferroelectric thin film before and after annealing in the forming gas are shown in Table 8. In addition, the value x is 0.3. From the microscopic photograph of FIG. 2C, it is apparent that any damage is not observed in the upper electrode after annealing in the forming gas. A difference between the P-E hysteresis loops of the ferroelectric thin film before and after annealing in the forming gas is also very small. In addition, the absolute values of $Ec^+$ and $Ec^-$ of the ferroelectric thin film after annealing in the forming gas are nearly equal to each other. Thus, the P-E hysteresis loop of the ferroelectric thin film is improved.

TABLE 8

|  | before annealing | after annealing |
|---|---|---|
| 2Pr ($\mu C/cm^2$) | 22.27 | 21.35 |
| $Ec^+$ (kV/cm) | 42.78 | 47.12 |
| $Ec^-$ (kV/cm) | −57.14 | −49.92 |

Embodiment 4

In this embodiment, a semiconductor memory cell is fabricated in accordance with the capacitor structure of a semiconductor memory cell and the fabrication process thereof according to the present invention. It is to be noted that the semiconductor memory cell in this embodiment is a so-called planar type FERAM. Hereinafter, the process of fabricating the capacitor structure of the semiconductor memory cell in this embodiment will be described with reference to FIGS. 7A to 9B. In addition, this embodiment adopts the process of fabricating the capacitor structure of the semiconductor memory cell according to the second aspect of the present invention.

[Step-400]

First, a MOS transistor element functioning as a selective transistor in a semiconductor memory cell is formed on a semiconductor substrate 10. Specifically, an isolation region 11 having, for example, a LOCOS structure was formed in accordance with a known process. In addition, the isolation region may be of a trench structure. The surface of the semiconductor substrate 10 was oxidized by typically a pyrogenic process, to form a gate oxide film 12. Next, a polycrystalline silicon layer doped with an impurity was formed over the entire surface by CVD, and patterned to form a gate electrode 13. The gate electrode 13 serves as a word line. In addition, the gate electrode 13 may be made from polycide or metal silicide in place of poly-silicon. Then, ions were implanted in the semiconductor substrate 10, to form a LDD structure. After that, a $SiO_2$ film was formed over the entire surface by CVD, and etched-back to form gate side walls 14 on side surfaces of the gate electrode 13. Ions were implanted in the semiconductor substrate 10, followed by active annealing of the impurity thus implanted, to form a source/drain region 15.

[Step-410]

An interlayer insulating film 20 was formed over the entire surface. For example, the interlayer insulating film 20 was of a four-layered structure having a PSG layer (thickness: 0.1 μm) formed by CVD, a SiN layer (thickness: 0.01 μm) formed by CVD, a BPSG layer (thickness: 0.3 μm) formed by CVD using $O_3$-TEOS, and a NSG layer (thickness: 0.1 μm) by CVD using $O_3$-TEOS. These layers are arranged from bottom in this order. In addition, the configuration of the insulating interlayer film 20 is not limited to the above one. After formation of the third layer, that is, BPSG layer, it is preferably subjected to planarization by heat-treatment in $N_2$ gas. In the figure, the interlayer insulating film 20 having the four-layered structure is shown as that having a single layer structure for simplification.

[Step-420]

A buffer layer 21 made from Ti was formed on the interlayer insulating film 20 by sputtering. The buffer layer 21 is formed for improving an adhesive strength of a lower electrode to the interlayer insulating film 20 and enhancing the crystallinity of the lower electrode. A lower electrode layer 22A made from Pt was formed on the buffer layer 21 by sputtering. A ferroelectric thin film 23A made from $Bi_xSr_yTa_2O_d$ expressed in the equation (2) was formed over the entire surface of the lower electrode layer 22A by a sol-gel process. The ferroelectric thin film thus formed is preferably subjected to post-baking in an oxygen gas atmosphere at 800° C. for one hour for promoting the crystallinity of the thin film. The film formation conditions of the buffer layer made from Ti and the lower electrode layer 22A made from Pt may be the same as those shown in Table 2.

[Step-430]

A Ru layer was formed on the ferroelectric thin film 23A in a condition shown in Table 9. The Ru layer thus formed was heat-treated in an oxygen gas atmosphere (flow rate of oxygen: 8 l/min) at a temperature T'=600° C. for 15 min, to form an upper electrode layer 24A made from $Ru_{1-x}O_x$ (x=0.3). Thus, there can be obtained a structure shown in FIG. 7A.

Table 9

[Film Formation Condition of Ru Layer]

target: Ru process gas: Ar=40 sccm pressure: 0.2 Pa power: 150–300 W distance from target: about 30 cm sputtering rate: 5–10 nm/min film thickness: about 0.2 μm

[Step-440]

Figure 7A:
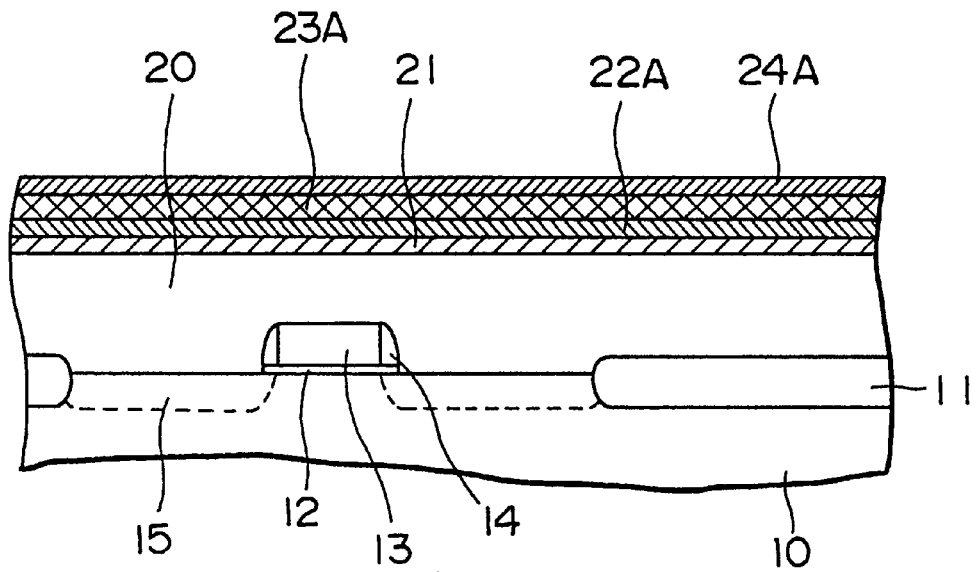
FIGS. 7A to 9B are typical partial sectional views of a semiconductor substrate and the like, illustrating a process of fabricating a semiconductor memory cell in Embodiment 4.
Figure 7B:
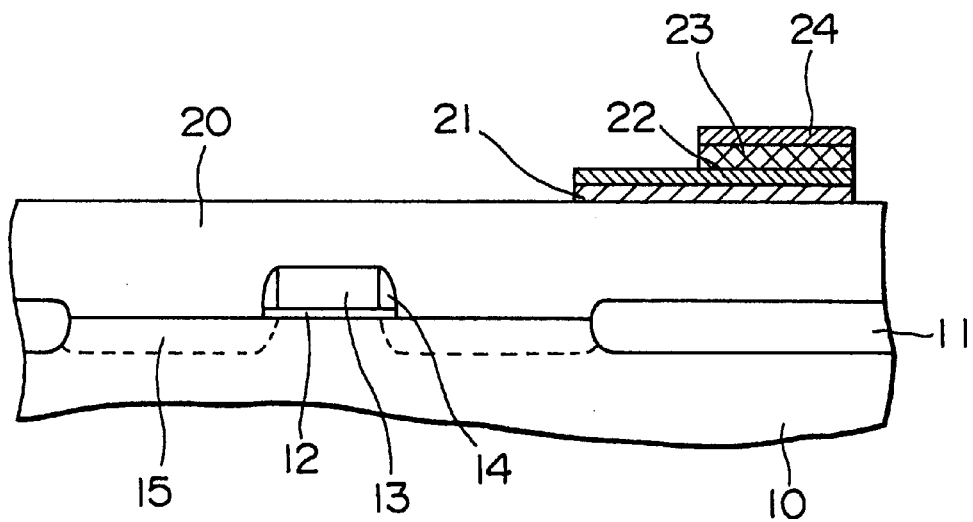

The upper electrode layer 24A, ferroelectric thin film 23A, lower electrode layer 22A, and buffer layer 21 were patterned by RIE, to form a capacitor structure having a lower electrode 22, a capacitor thin film 23, and an upper electrode 24 (see FIG. 7B). Alternatively, after patterning of the Ru layer, ferroelectric thin film 23A, lower electrode layer 22A, and buffer layer 21 by RIE, the Ru layer may be heat-treated in the oxygen gas atmosphere at a temperature T° C. (575<T'<625), to form an upper electrode layer made from $Ru_{1-x}O_x$ (0.1<x<0.64) on the ferroelectric thin film.

[Step-450]

Figure 8A:
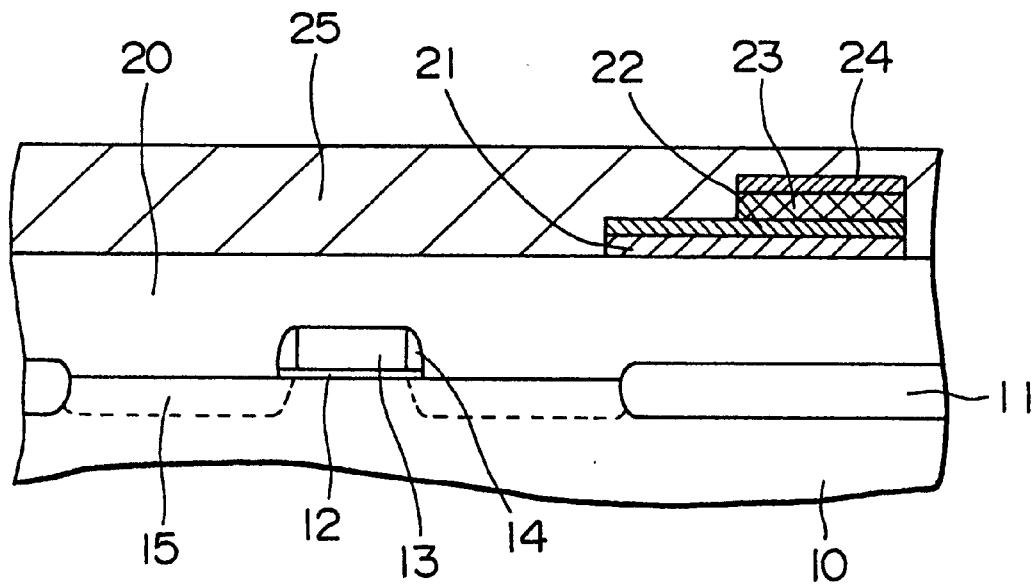

An insulating film 25 was formed over the entire surface (see FIG. 8A). The insulating film 25 was of a three-layered structure having a $SiO_2$ layer (thickness: 0.1 μm) formed by plasma CVD using TEOS, a SNG layer (thickness: 0.3 μm) formed by CVD using $O_3$-TEOS, and a $SiO_2$ layer (thickness: 0.2 μm) formed by plasma CVD using TEOS. The layer structure of the insulating film 25 is not limited to the above one. In addition, each of the first and third $SiO_2$ layers was formed by CVD in a hydrogen gas atmosphere at a substrate temperature of about 400° C. In the figure, the insulating film 25 having the three-layered structure is shown as that having a single layer structure for simplification.

[Step-460]

Openings 26 were formed in the insulating film 25 and the interlayer insulating film 20 at positions over the source/drain region 25 by RIE, and then the semiconductor substrate was annealed in a $N_2$ gas atmosphere.

[Step-470]

Figure 8B:
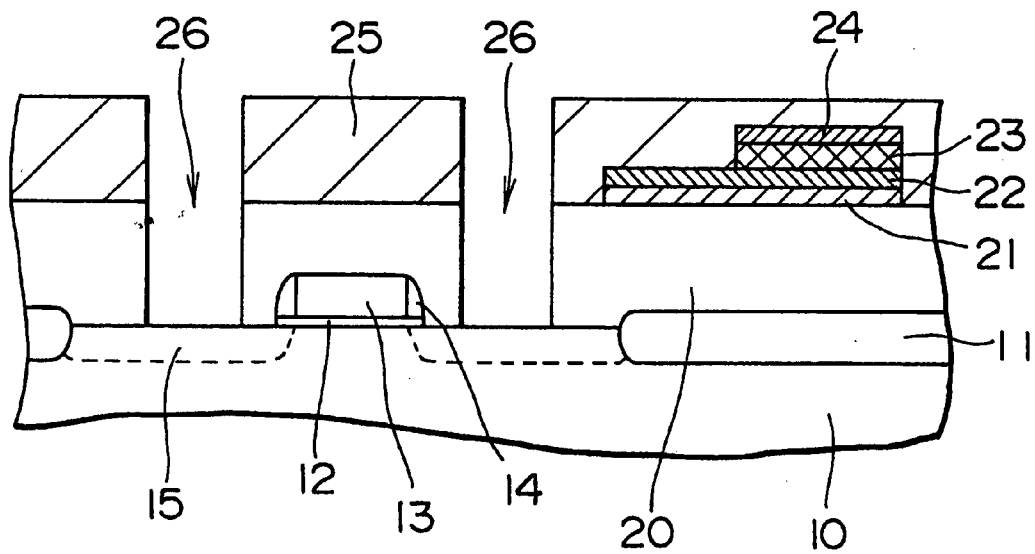

The semiconductor substrate was annealed in a forming gas composed of a mixed gas of $N_2$ gas/$H_2$ gas (5 vol %) at a temperature of 400 to 450° C. for 0.5–1 hr (see FIG. 8B).

[Step-480]

Figure 9A:
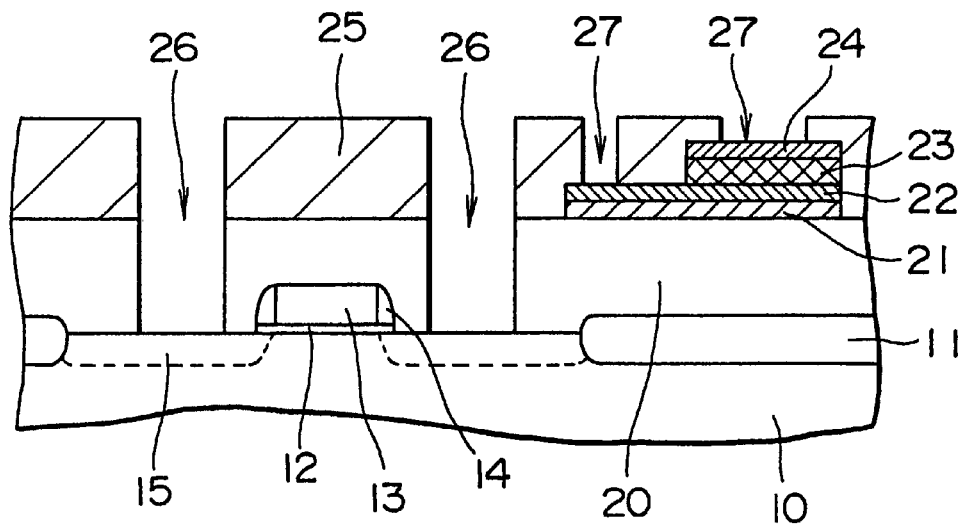
Figure 9B:
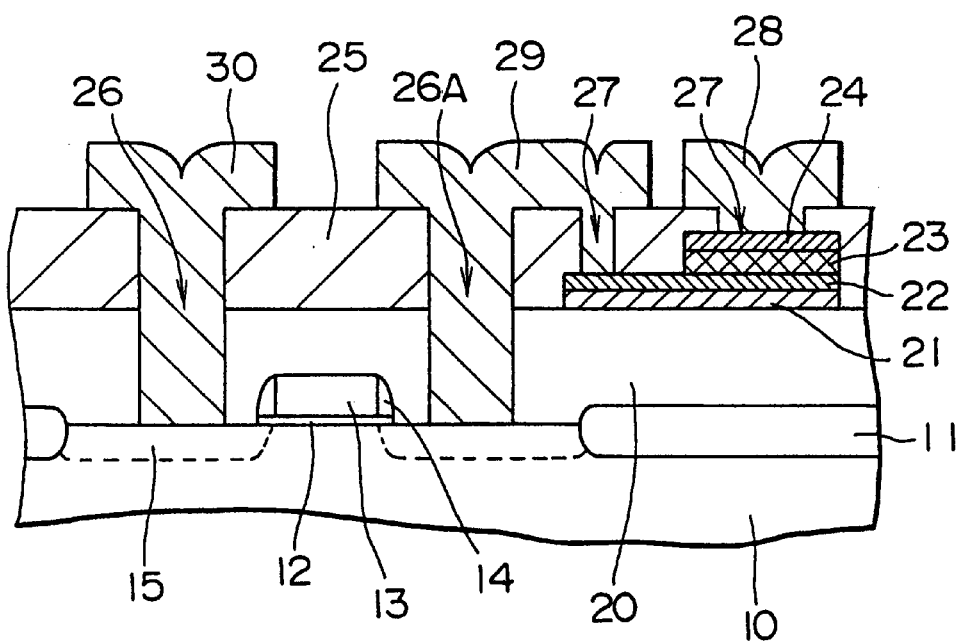

Openings 27 were formed in a portion of the insulating film 25 over the lower electrode 22 extending from the capacitor structure and also in a portion of the insulating film 25 over the upper electrode 24 (see FIG. 9A). Then, for example, a Ti layer, a TiN layer, an aluminum based alloy layer, a Ti layer, a TiN layer, and a Ti layer were sequentially formed on the insulating film 25 including the openings 26 and 27 by sputtering, and were patterned so that one source/drain region 15 was electrically connected to the lower electrode 22 through an interconnection 29 and a contact plug 26A; a plate line 28 formed on the insulating film 25 was connected to the upper electrode 24; and the other source/drain region 15 was connected to a bit line 30. Thus, there can be fabricated a semiconductor memory cell shown in FIG. 9B. In addition, each of the plate line 28, interconnection 29 and bit line 30 is shown as that having a single layer structure for simplification. Finally, a passivation film made from SiN was formed over the entire surface by plasma CVD. In formation of the passivation film, the concentration of hydrogen gas in the atmosphere was 15–30 vol %, and the semiconductor substrate was heated at a temperature of 280 to 350° C.

Embodiment 5

Figure 10A:
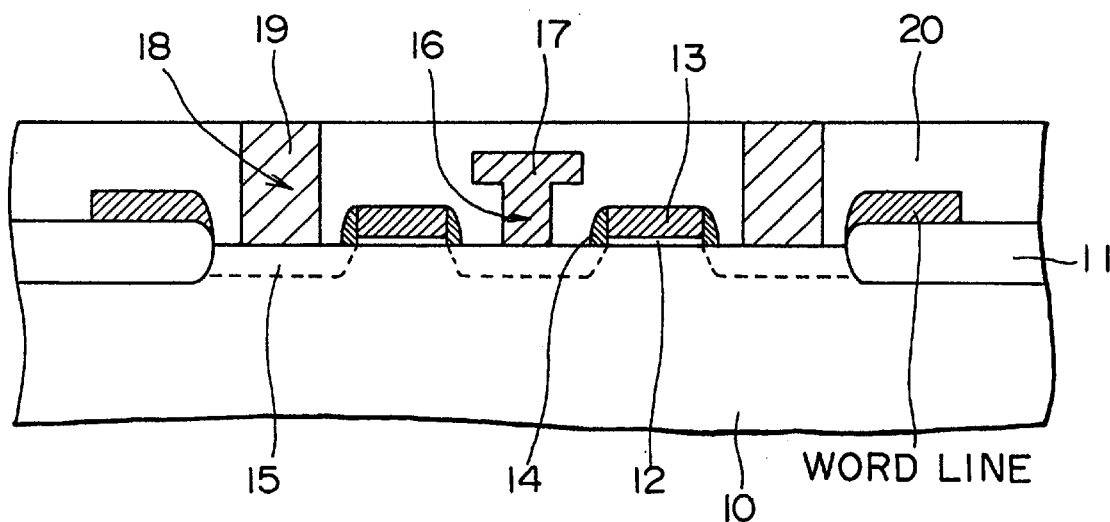
FIGS. 10A, 10B and 11 are typical partial sectional views of a semiconductor substrate and the like, illustrating a process of fabricating a semiconductor memory cell in Embodiment 5.
Figure 10B:
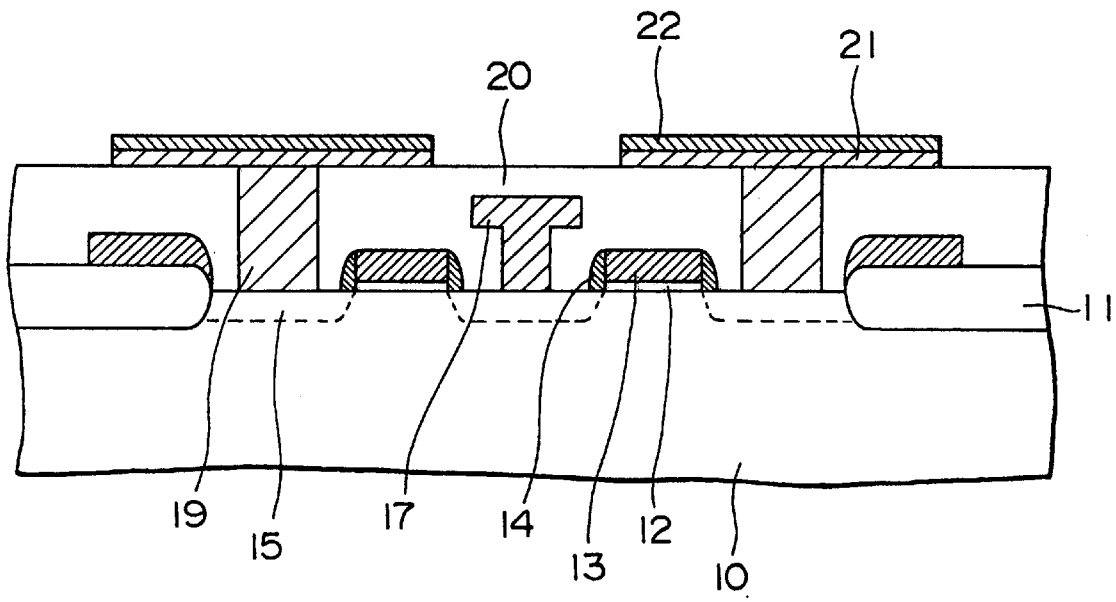
Figure 11:
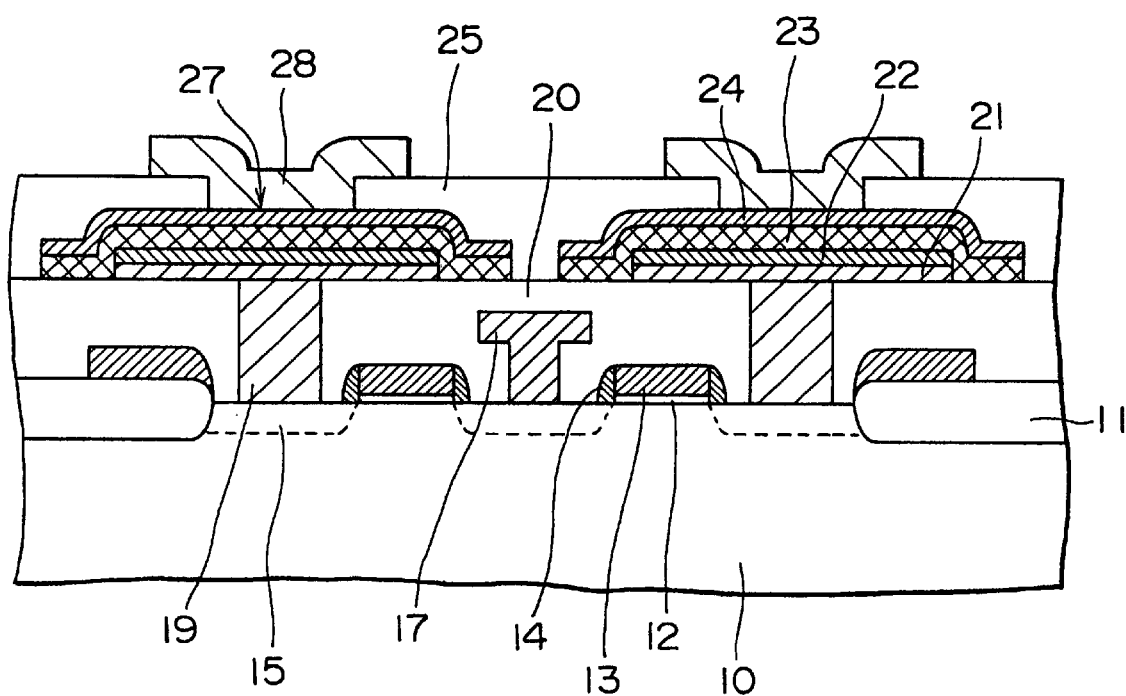

In this embodiment, a so-called stack type FERAM is fabricated in accordance with the capacitor structure of a semiconductor memory cell and the fabrication process thereof according to the present invention. Hereinafter, a process of fabricating a capacitor structure of a semiconductor memory cell in this embodiment will be described with reference to FIGS. 10A, 10B and 11. It is to be noted that this embodiment adopts the process of fabricating the capacitor structure of a semiconductor memory cell according to the first aspect of the present invention.

[Step-500]

First, similarly to [Step-400] in Embodiment 4, a MOS transistor was formed on a semiconductor substrate 10.

[Step-510]

A first interlayer insulating film made from $SiO_2$ was formed by CVD and then an opening 16 was formed in the first insulating film at a position over the other source/drain region 15 by RIE. A polycrystalline silicon layer doped-with an impurity was formed on the first interlayer insulating film including the opening 16 by CVD. The polycrystalline silicon layer thus formed on the first interlayer insulating film was patterned to form a bit line 17. After that, a second interlayer insulating film made from BPSG was formed over the entire surface by CVD in a condition shown in the following:

gas used: $SiH_4/PH_3/B_2H_6$ film formation temperature: 400° C.

reaction pressure: normal pressure

The second interlayer insulating film thus formed is preferably heat-treated in a nitrogen gas atmosphere at 900° C. for 20 min for making the second interlayer insulating film reflow. Further, as needed, the top surface of the second interlayer insulating film may be planarized by typically a chemical-mechanical polishing (CMP) process. In addition, the first and second interlayer insulating films are referred to simply to "an interlayer insulating film 20".

An opening 18 was formed in the interlayer insulating film 20 at a position over one source/drain region 15 by RIE, and is buried with polycrystalline silicon doped with an impurity, to thereby form a contact plug 19. Thus, there can be obtained a structure shown in FIG. 10A which typically shows the partial cross-section of the structure. In the figure, the first and second interlayer insulating films are expressed by the interlayer insulating film 20. The bit line 17 actually extends on the first interlayer insulating film right and left in such a manner as not to be brought in contact with the contact plug 19; however, in the figure, such illustration of the bit line is omitted.

The contact plug 19 may be formed by burying the opening 18 formed in the interlayer insulating film 20 with a metal interconnection material such as a high melting point material such as W, Ti, Pt, Pd, Cu, TiW, TiNW, $WSi_2$ or $MoSi_2$, or a metal silicide. The top surface of the contact plug may be substantially at the same level as that of the surface of the interlayer insulating film 20, or the top portion of the contact plug may extend on the surface of the interlayer insulating film 20. The condition for forming the contact plug 19 by burying the opening 18 with tungsten is shown in Table 10. In addition, before burying the opening 18 with tungsten, a Ti layer and a TiN layer were sequentially formed on the interlayer insulating film 20 including the interior of the opening 18 by magnetron sputtering. The reason why the Ti layer and TiN layer are formed is to obtain a low ohmic contact resistance, to prevent occurrence of a damage of the semiconductor substrate 10 by blanket tungsten CVD, and to improve an adhesive strength of tungsten.

Table 10

[Sputtering Condition of Ti Layer (thickness: 20 μm)]

process gas: Ar=35 sccm pressure: 0.52 Pa

RF power: 2 kW heating of substrate: not heated

[Sputtering Condition of TiN Layer (thickness: 100 nm)]

process gas: $N_2$/Ar=100 sccm/35 sccm pressure: 1.0 Pa

RF power: 6 kW heating is substrate: not heated

[CVD Film Formation Condition of Tungsten]

gas used: $WF_6/H_2$/Ar=40 sccm/400 sccm/2250 sccm pressure: 10.7 kPa film formation temperature: 450° C.

[Etching Conditions of W Layer, and TiN Layer/Ti Layer]

Etching at First Stage: Etching of W Layer gas used: $SF_6$/Ar/He=110 sccm/:90 sccm/:5 sccm pressure: 46 Pa RF power: 275 W Etching at Second Stage: Etching of TiN Layer/Ti Layer gas used: Ar/$Cl_2$=75 sccm/:5 sccm pressure: 6.5 Pa RF power: 250 W

[Step-520]

Similarly to [Step-420] in Embodiment 4, a buffer layer 21 made from Ti was formed on the interlayer insulating film 20 by sputtering and a lower electrode layer made from Pt was formed thereon by sputtering. The sputtering conditions for forming the buffer layer 21 made from Ti and the lower electrode layer made from Pt may be the same as those shown in Table 2. The lower electrode layer and the buffer layer 21 were patterned to form a lower electrode 22 (see FIG. 10B).

[Step-530]

A ferroelectric thin film made from $Bi_xSr_yTa_2O_d$ expressed in the equation (2) was formed over the entire surface including the surface of the lower electrode 22 by a sol-gel process. The ferroelectric thin film thus formed is preferably subjected to post-baking in an oxygen gas atmosphere at 800° C. for one hour for promoting the crystallinity of the thin film.

[Step-540]

An upper electrode layer made from $Ru_{1-x}O_x$ (x=0.3) was formed on the ferroelectric thin film by sputtering in a condition shown in Table 11. Next, the upper electrode layer and the ferroelectric thin film were patterned to form a capacitor thin film 23 composed of the ferroelectric thin film on the lower electrode 22 and an upper electrode 24 on the capacitor thin film 23. In addition, after formation of the upper electrode layer and before patterning thereof, the upper electrode layer may be heat-treated in an oxygen gas atmosphere at a temperature T° C. (T<625). Alternatively, after patterning of the upper electrode layer and the ferroelectric thin film, the upper electrode layer may be heat-treated in the oxygen gas atmosphere at temperature T° C. (T<625).

Table 11

[Film Formation Condition of Upper Electrode Layer Made from $Ru_{1-x}O_x$]

target: Ru process gas: Ar/$O_2$=29.3 sccm/0.7 sccm pressure: 0.3 Pa power: 200 W distance from target: 80–90 mm sputtering rate: 5–20 nm/min film thickness: about 0.2 μm

[Step-550]

After that, an insulating film 25 was deposited over the entire surface, and an opening 27 was formed in the insulating film 25 at a position over the upper electrode 24 by RIE. A metal interconnection layer made from, for example, an aluminum based alloy was formed on the insulating film 25 including the interior of the opening 27 by sputtering, and was patterned to form a plate line 28. Thus, there can be obtained a structure shown in FIG. 11 which typically shows the partial cross-section of the structure.

Figure 12:
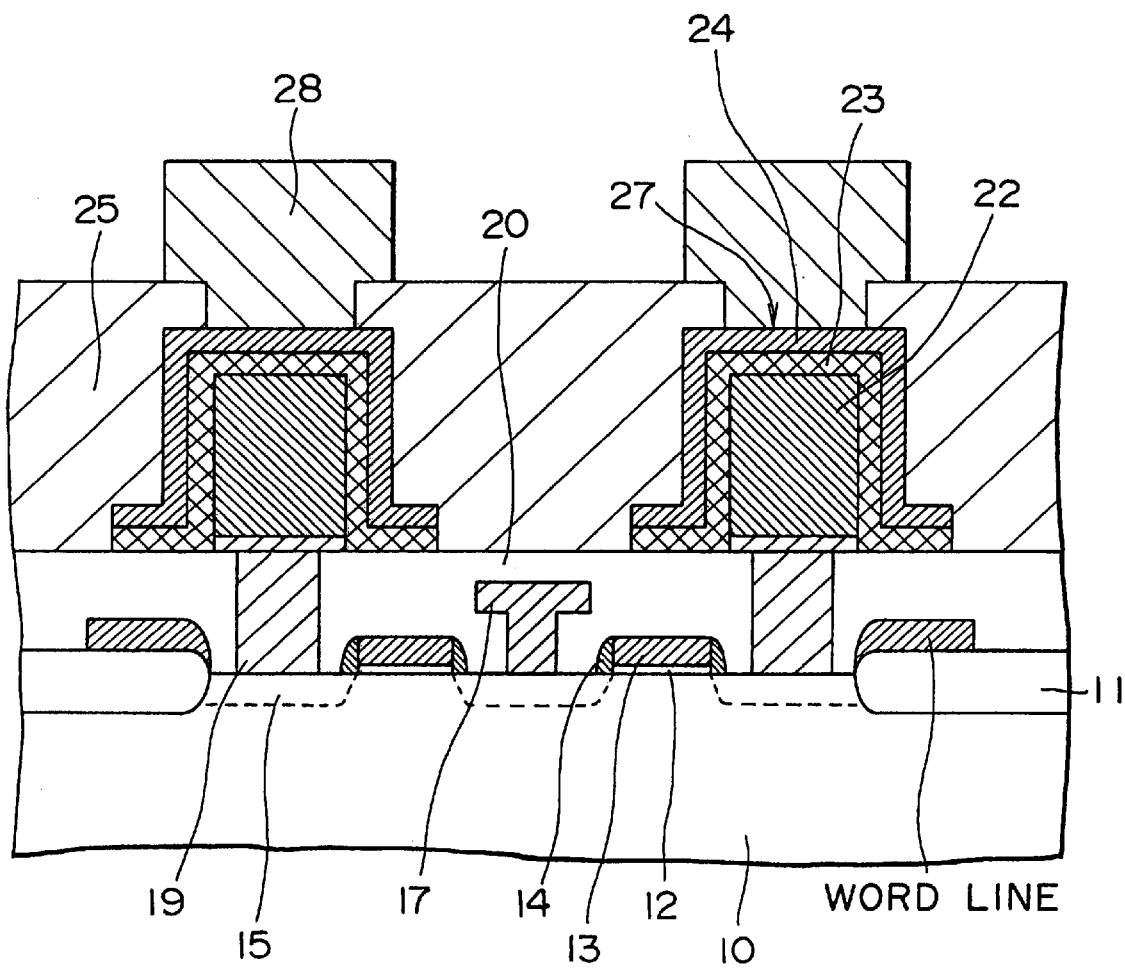
FIG. 12 is a typical partial sectional view of a pedestal type semiconductor memory cell.
Figure 13:
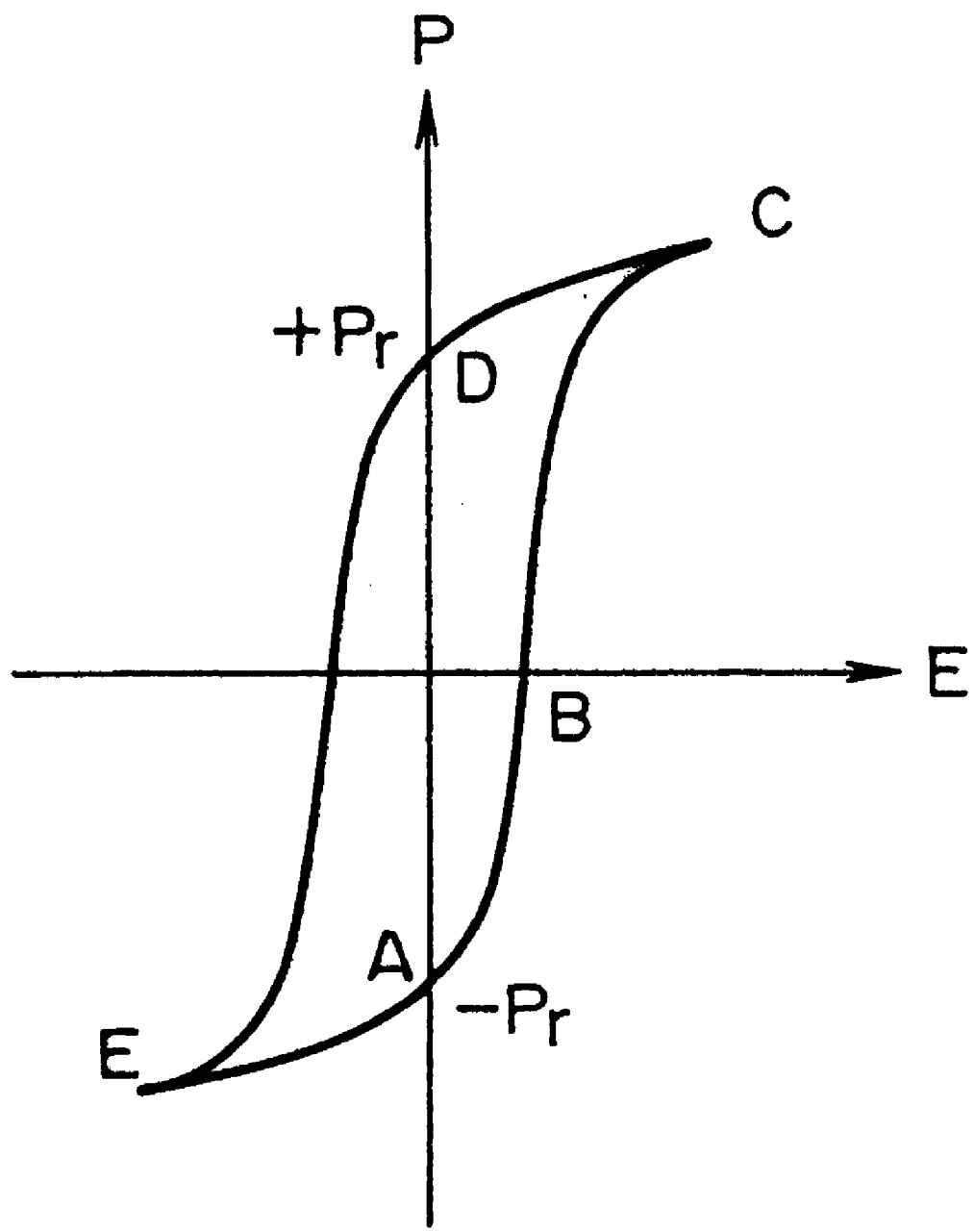
FIG. 13 is a graph showing a P-E hysteresis loop of a ferroelectric material.
Figure 14A:
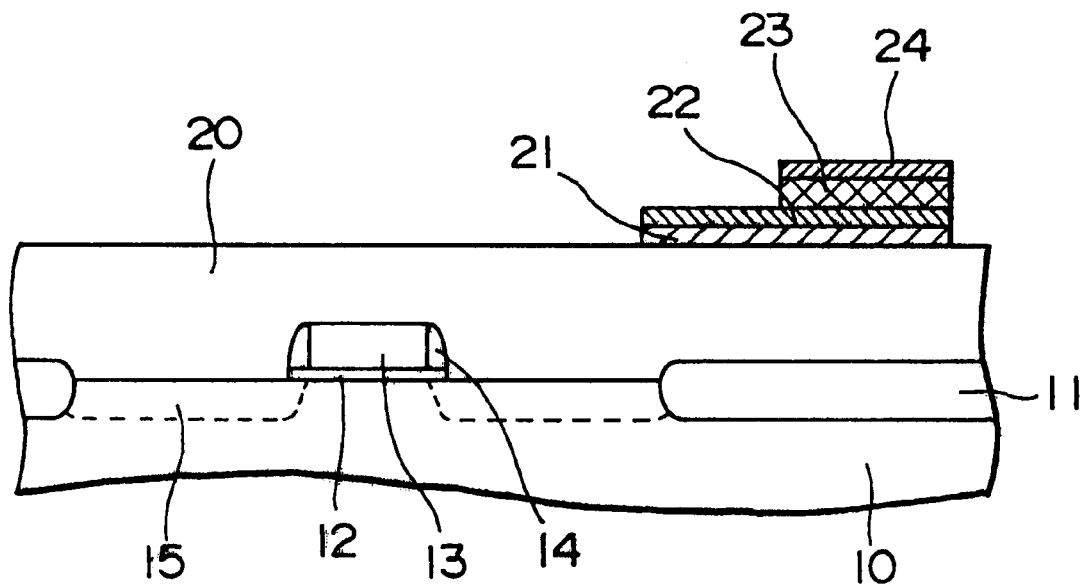
Figure 14B:
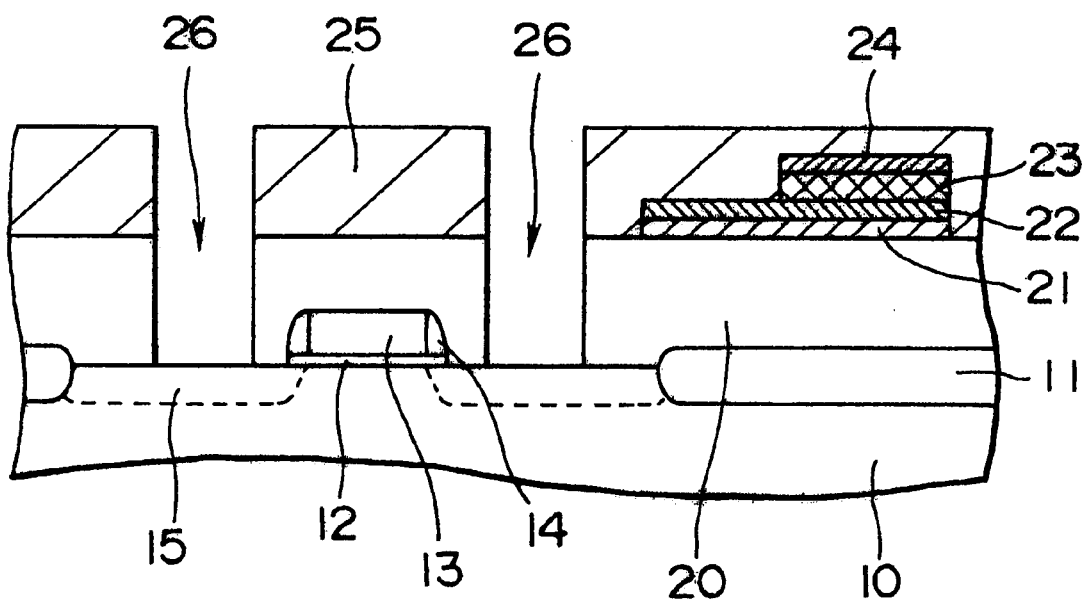
Figure 16A:
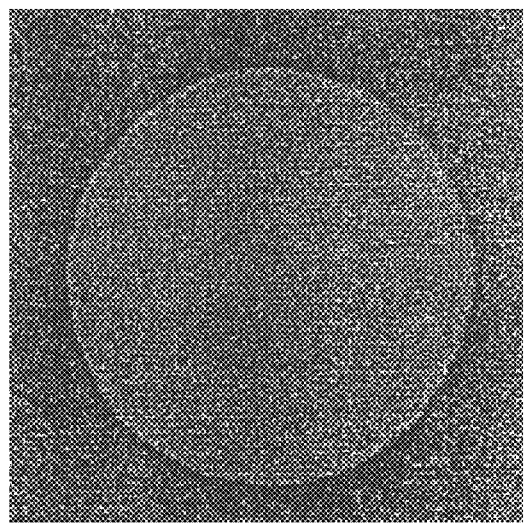
FIGS. 16A and 16B are photographs showing results of microscopically examining a difference between surface states of an upper electrode made from Pt before and after annealing in a forming gas at 430° C. for one hour.
Figure 16B:
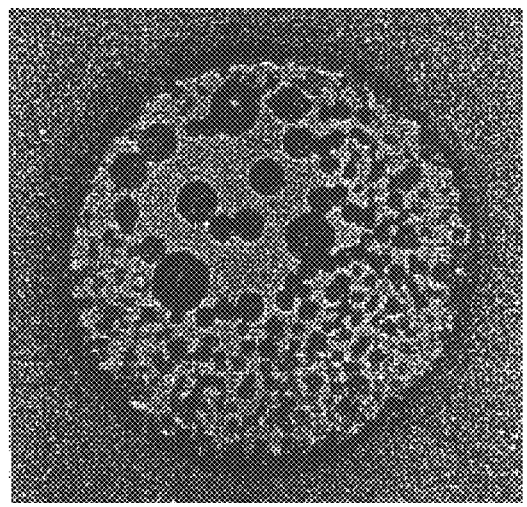
Figure 17:
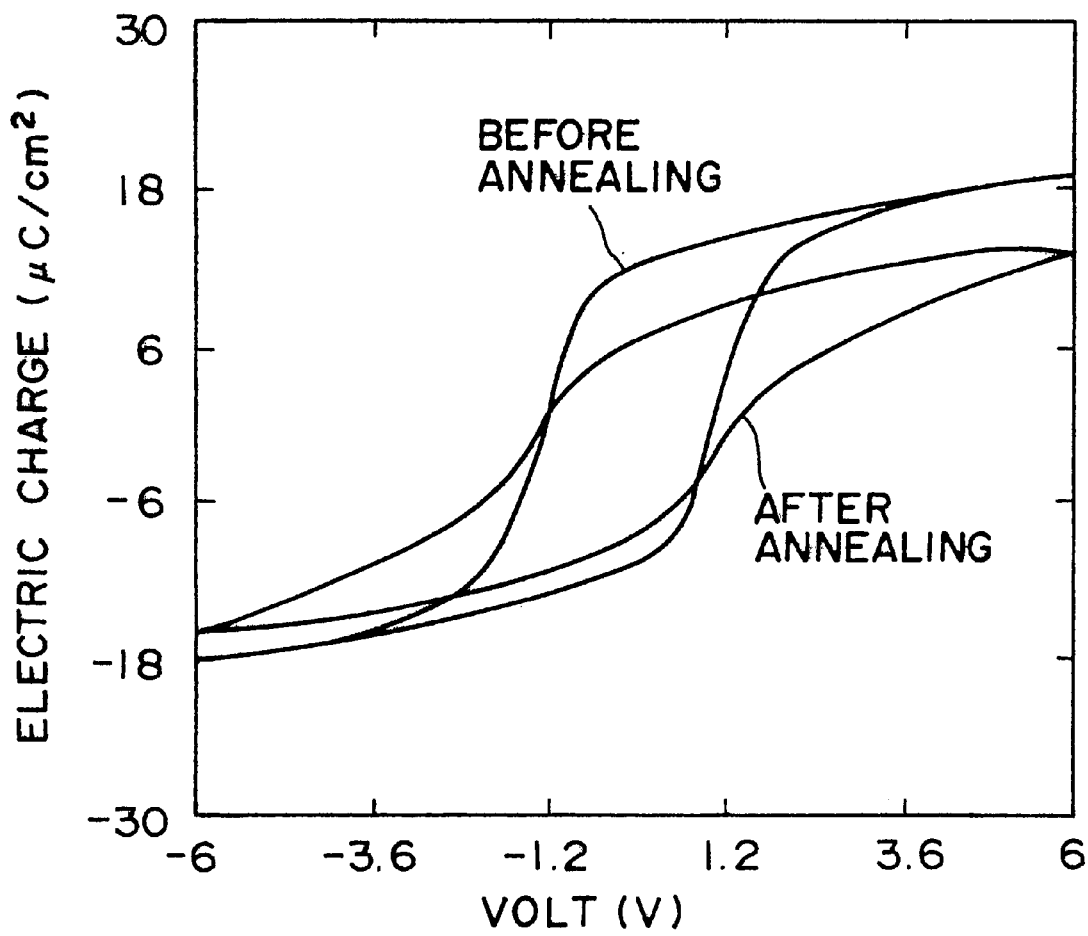
FIG. 17 is a graph showing a difference between P-E hysteresis loops of the ferroelectric thin film before and after annealing in the forming gas at 430° C. for one hour.

A pedestal type FERAM which is one of stack type FERAMs can be fabricated in accordance with a process similar to the process described in Embodiment 5. In a pedestal type FERAM shown in FIG. 12 which typically shows the partial cross-section of the pedestal type FERAM, a lower electrode 22 has a columnar shape, and a ferroelectric thin film covers the surface of the lower electrode 22. Such a structure allows the effective area of a capacitor thin film 23 to be enlarged.

While the embodiments have been described using the specific terms, the present invention is not limited thereto. The materials of the interlayer insulating film 20 and the insulating film 25 are only illustrative, and for example, they may include known insulating materials such as BPSG, PSG, BSG, AsSG, PbSG, SbSG, and SOG.

A metal layer or a metal oxide layer constituting part of the upper electrode may be formed between the upper electrode layer made from $Ru_{1-x}O_x$ and the capacitor thin film formed of the ferroelectric thin film. The upper electrode layer made from $Ru_{1-x}O_x$ may be formed by MOCVD in an oxygen gas atmosphere using $Ru(C_5H_7O_2)_3$ or $Ru(C_5H_5)_2$ as a source gas. Alternatively, the Ru layer may be formed by MOCVD in a hydrogen gas atmosphere using $Ru(C_5H_7O_2)_3$ or $Ru(C_5H_5)_2$ as a source gas.

The upper electrode layer made from $Ru_{1-x}O_x$ or the Ru layer may be formed by reactive sputtering or electron beam deposition in a condition similar to that shown in Table 11. In this case, the electron beam deposition is performed by irradiating an electron beam (500 W) to a Ru metal chip at a deposition rate of 500 nm/min.

The thin film made from $Bi_xSr_yTa_2O_d$ expressed in the equation (2) may be formed by MOCVD or pulse laser abrasion in a condition shown in Table 12. In Table 12, [thd] is the abbreviation of tetramethyl heptanediol. In the case of forming the thin film made from $Bi_xSr_yTa_2O_d$ expressed in the equation (2) using the pulse laser abrasion process, the thin film thus formed is preferably subjected to post-baking in an oxygen gas atmosphere at 800° C. for one hour.

TABLE 12

[Film Formation by MOCVD]

| | |
|---|---|
| source material: | $Sr(thd)_2$ |
| | $Bi(C_6H_5)_3$ |
| | $Ta(O-iC_3H_7)_4(thd)$ |
| film formation temperature: | 500–700° C. |
| process gas: | $Ar/O_2$ = 1000 cm³/1000 cm³ |
| film formation rate: | 10–20 nm/min |

[Film Formation by Pulse Laser Abrasion]

| | |
|---|---|
| target: | $Bi_xSr_yTa_2O_d$ |
| laser used: | krF excimer laser |
| | (wavelength: 248 nm, |
| pulse width: | 25 nsec, 5 Hz) |
| film formation temperature: | 500° C. |
| concentration of oxygen: | 3 Pa |

The ferroelectric thin film may be made from PZT or PZLT in place of a ferroelectric material of a Bi based layer structure perovskite type. The condition of forming a PZT or PZLT film by sputtering is shown in Table 13. The PZT or PZLT film may be also formed by reactive sputtering, electron beam deposition, or MOCVD.

Table 13 target: PZT or PZLT process gas: $Ar/O_2$=90 vol %/10 vol % pressure: 4 Pa power: 50 w film formation temperature: 500° C.

Further, the PZT or PZLT film may be formed by pulse laser abrasion in a condition shown in Table 14.

Table 14 target: PZT or PZLT laser used: krF excimer laser (wavelength: 248 nm, pulse width: 25 nsec, 3 Hz)

output energy: 400 mJ (1/1 J/cm²)

film formation temperature: 550–600° C.

concentration of oxygen: 40–120 Pa

The lower electrode layer made from Pt may be formed by RF magnetron sputtering in a condition shown in Table 15.

Table 15 target: Pt process gas: $Ar/O_2$=90 sccm/10 sccm pressure: 0.7 Pa anode voltage: 2.6 kV input power: 1.1–1.6 W/cm² film formation temperature: 600–750° C.

deposition rate: 5–10 nm/min

The lower electrode may be also made from LSCO by pulse laser abrasion in a condition shown in Table 16.

Table 16 target: LSCO laser used: krF excimer laser (wavelength: 248 nm, pulse width: 25 nsec, 3 Hz)

output energy: 400 mJ (1.1 J/cm²)

film formation temperature: 550–600° C.

concentration of oxygen: 40–120 Pa

The buffer layer may be made from bismuth titanate ($Bi_4Ti_3O_{12}$) in place of titanium. In this case, the buffer film may be formed by pulse laser abrasion (pulse laser deposition), MOCVD, or sputtering. One example of the condition using the pulse laser abrasion is shown in Table 17.

Table 17 target: bismuth titanate krF excimer laser (wavelength: 248 nm, pulse width: 25 nsec, 3 Hz)

film formation temperature: 600–770° C.

concentration of oxygen: 7–27 Pa film formation temperature: 0.05–0.1 nm/min

The capacitor structure of a semiconductor memory cell and the fabrication process thereof according to the present invention can be applied not only to a nonvolatile memory cell (so-called FERAM) using a ferroelectric thin film but also to a DRAM using a ferroelectric thin film. In the case where the present invention is applied to the DRAM, only polarization of the ferroelectric thin film is used. Specifically, there is used a characteristic in which a difference ($P_{max}$-Pr) between the maximum (saturated) polarization $P_{max}$ due to an external electric field and a residual polarization Pr in the case where the external electric field is zero has a specific proportional relationship with the power supply voltage. The polarization state of the ferroelectric thin film usually lies between the saturated polarization ($P_{max}$) and the residual polarization (Pr), and thereby it is not reversed. Data is held by refresh.

In the present invention, there can be obtained a capacitor structure of a semiconductor memory cell in which an upper electrode made from $Ru_{1-x}O_x$ (0.1<X<0.64) is less susceptible to a damage even by heat-treatment in a hydrogen gas atmosphere used in annealing in a forming gas or in CVD film formation. Further, the capacitor structure of the present invention makes it possible to suppress a difference between P-E hysteresis loops of a ferroelectric thin film before and after heat-treatment in a hydrogen gas atmosphere, and hence to stabilize the characteristics thereof. Further, the process of fabricating the capacitor structure of a semiconductor memory cell according to the present invention eliminates the necessity of addition of any step to the related art process of fabricating the capacitor structure.

What is claimed is:

1. A process of fabricating a capacitor structure of a semiconductor memory cell including a lower electrode, a capacitor thin film composed of a ferroelectric thin film formed on the lower electrode, and an upper electrode formed on the capacitor thin film, comprising the step of:

forming, the upper electrode layer made from $Ru_{1-x}O_x$ where $0.1<x<0.64$, on the ferroelectric thin film by sputtering, reactive sputtering, electron beam deposition, or MOCVD.

2. A process of fabricating a capacitor structure of a semiconductor memory cell according to claim 1, further comprising the step of heat-treating the upper electrode layer formed by sputtering, reactive sputtering, electron beam deposition, or MOCVD, in an oxygen gas atmosphere at a temperature T° C. (T<625).

3. A process of fabricating a capacitor structure of a semiconductor memory cell including a lower electrode, a capacitor thin film composed of a ferroelectric thin film formed on the lower electrode, and an upper electrode formed on the capacitor thin film, comprising the steps of:

forming a Ru layer on the ferroelectric thin film by sputtering, reactive sputtering, electron beam deposition, or MOCVD; and heat-treating the Ru layer in an oxygen gas atmosphere at a temperature T'° C. (575<T'<625);

whereby the upper electrode layer made from $Ru_{1-x}O_x$ where $0.1<x<0.64$ is formed on the ferroelectric thin film.

4. A process of fabricating a capacitor structure of a semiconductor memory cell according to claim 1, wherein the ferroelectric thin film is made from a ferroelectric material of a Bi based layer structure perovskite type.

5. A process of fabricating a capacitor structure of a semiconductor memory cell according to claim 1, wherein the ferroelectric thin film contains, as a main crystal phase, a crystal phase expressed by $Bi_X(Sr, Ca, Ba)_Y(Ta_Z, Nb_{1-Z})_2O_d$ where $1.7 \leq X \leq 2.5$, $0.6 \leq Y \leq 1.2$, $0 \leq Z \leq 1.0$, and $8.0 \leq d \leq 10.0$.

6. A process of fabricating a capacitor structure of a semiconductor memory cell according to claim 1, wherein the ferroelectric thin film is made from $Pb(Zr_{1-y}, Ti_y)O_3$ where $0<y<1$.

7. A process of fabricating a capacitor structure, comprising the steps of:

forming a lower electrode on a substrate;

forming a ferroelectric thin film on the lower electrode; and forming a thin film made from $Ru_{1-x}O_x$ where $0.1<x<0.64$ on the ferroelectric thin film.

8. A process of fabricating a capacitor structure according to claim 7, wherein the thin film made from $Ru_{1-x}O_x$ is formed in such a manner as to be brought in contact with the ferroelectric thin film.

9. A process of fabricating a capacitor structure according to claim 7, further comprising, after said step of forming the thin film made from $Ru_{1-x}O_x$, the step of annealing said thin film made from $Ru_{1-x}O_x$ in an atmosphere at least containing hydrogen.

* * * * *